(12) United States Patent
Cheng et al.

(10) Patent No.: US 7,348,259 B2
(45) Date of Patent: Mar. 25, 2008

(54) METHOD OF FABRICATING A SEMICONDUCTOR STRUCTURE THAT INCLUDES TRANSFERRING ONE OR MORE MATERIAL LAYERS TO A SUBSTRATE AND SMOOTHING AN EXPOSED SURFACE OF AT LEAST ONE OF THE MATERIAL LAYERS

(75) Inventors: Zhiyuan Cheng, Cambridge, MA (US); Eugene A. Fitzgerald, Windham, NH (US); Dimitri A. Antoniadis, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 351 days.

(21) Appl. No.: 11/028,248

(22) Filed: Jan. 3, 2005

(65) Prior Publication Data

US 2005/0136624 A1      Jun. 23, 2005

Related U.S. Application Data

(62) Division of application No. 10/116,559, filed on Apr. 4, 2002, now Pat. No. 6,940,089.

(60) Provisional application No. 60/281,502, filed on Apr. 4, 2001.

(51) Int. Cl.
*H01L 21/461* (2006.01)
(52) U.S. Cl. .................... 438/458; 257/E21.122
(58) Field of Classification Search ......... 257/E21.122
See application file for complete search history.

(56) References Cited

U.S. PATENT DOCUMENTS 4,010,045 A    3/1977  Ruehrwein (Continued)

FOREIGN PATENT DOCUMENTS

DE     41 01 167    7/1992

(Continued)

OTHER PUBLICATIONS

Fitzgerald et al., "Totally Relaxed $Ge_xSi_{1-x}$ Layers With Low Threading Dislocation Densities Grown on Si Substrates", Applied Physics Letters, 59 (7), Aug. 12, 1991.

(Continued)

*Primary Examiner*—Stephen W. Smoot
(74) *Attorney, Agent, or Firm*—Goodwin Procter LLP

(57) ABSTRACT

A method of fabricating a semiconductor structure. According to one aspect of the invention, on a first semiconductor substrate, a first compositionally graded $Si_{1-x}Ge_x$ buffer is deposited where the Ge composition x is increasing from about zero to a value less than about 20%. Then a first etch-stop $Si_{1-y}Ge_y$ layer is deposited where the Ge composition y is larger than about 20% so that the layer is an effective etch-stop. A second etch-stop layer of strained Si is then grown. The deposited layer is bonded to a second substrate. After that the first substrate is removed to release said first etch-stop $S_{1-y}Ge_y$ layer. The remaining structure is then removed in another step to release the second etch-stop layer. According to another aspect of the invention, a semiconductor structure is provided. The structure has a layer in which semiconductor devices are to be formed. The semiconductor structure includes a substrate, an insulating layer, a relaxed SiGe layer where the Ge composition is larger than approximately 15%, and a device layer selected from a group consisting of, but not limited to, strained-Si, relaxed $Si_{1-y}Ge_y$ layer, strained $Si_{1-z}Ge_z$ layer, Ge, GaAs, III-V materials, and II-VI materials, where Ge compositions y and z are values between 0 and 1.

8 Claims, 10 Drawing Sheets

U.S. PATENT DOCUMENTS

| | | | |
|---|---|---|---|
| 4,370,510 A * | 1/1983 | Stirn | 136/262 |
| 4,704,302 A | 11/1987 | Bruel et al. | |
| 4,710,788 A | 12/1987 | Dambkes et al. | |
| 4,969,031 A | 11/1990 | Kobayashi et al. | |
| 4,987,462 A | 1/1991 | Kim et al. | |
| 4,990,979 A | 2/1991 | Otto | |
| 4,997,776 A | 3/1991 | Harame et al. | |
| 5,089,872 A | 2/1992 | Ozturk et al. | |
| 5,091,767 A | 2/1992 | Bean et al. | |
| 5,155,571 A | 10/1992 | Wang et al. | |
| 5,166,084 A | 11/1992 | Pfiester | |
| 5,177,583 A | 1/1993 | Endo et al. | |
| 5,202,284 A | 4/1993 | Kamins et al. | |
| 5,207,864 A | 5/1993 | Bhat et al. | |
| 5,208,182 A | 5/1993 | Narayan et al. | |
| 5,212,110 A | 5/1993 | Pfiester et al. | |
| 5,240,876 A | 8/1993 | Gaul et al. | |
| 5,241,197 A | 8/1993 | Murakami et al. | |
| 5,242,847 A | 9/1993 | Ozturk et al. | |
| 5,250,445 A | 10/1993 | Bean et al. | |
| 5,285,086 A | 2/1994 | Fitzgerald | |
| 5,291,439 A | 3/1994 | Kauffmann et al. | |
| 5,298,452 A | 3/1994 | Meyerson | |
| 5,310,451 A | 5/1994 | Tejwani et al. | |
| 5,316,958 A | 5/1994 | Meyerson | |
| 5,346,848 A | 9/1994 | Grupen-Shemansky et al. | |
| 5,374,564 A | 12/1994 | Bruel | |
| 5,399,522 A | 3/1995 | Ohori | |
| 5,405,802 A | 4/1995 | Yamagata et al. | |
| 5,413,679 A | 5/1995 | Godbey | |
| 5,424,243 A | 6/1995 | Takasaki | |
| 5,426,069 A | 6/1995 | Selvakumar et al. | |
| 5,426,316 A | 6/1995 | Mohammad | |
| 5,439,843 A | 8/1995 | Sakaguchi et al. | |
| 5,442,205 A | 8/1995 | Brasen et al. | |
| 5,461,250 A | 10/1995 | Burghartz et al. | |
| 5,479,033 A | 12/1995 | Baca et al. | |
| 5,484,664 A | 1/1996 | Kitahara et al. | |
| 5,523,243 A | 6/1996 | Mohammad | |
| 5,523,592 A | 6/1996 | Nakagawa et al. | |
| 5,534,713 A | 7/1996 | Ismail et al. | |
| 5,536,361 A | 7/1996 | Kondo et al. | |
| 5,548,128 A | 8/1996 | Soref et al. | |
| 5,572,043 A | 11/1996 | Shimizu et al. | |
| 5,596,527 A | 1/1997 | Tomioka et al. | |
| 5,607,876 A | 3/1997 | Biegelsen et al. | |
| 5,617,351 A | 4/1997 | Bertin et al. | |
| 5,630,905 A | 5/1997 | Lynch et al. | |
| 5,659,187 A | 8/1997 | Legoues et al. | |
| 5,683,934 A | 11/1997 | Candelaria | |
| 5,698,869 A | 12/1997 | Yoshimi et al. | |
| 5,705,421 A | 1/1998 | Matsushita et al. | |
| 5,714,777 A | 2/1998 | Ismail et al. | |
| 5,728,623 A | 3/1998 | Mori | |
| 5,739,567 A | 4/1998 | Wong | |
| 5,777,347 A | 7/1998 | Bartelink | |
| 5,786,612 A | 7/1998 | Otani et al. | |
| 5,786,614 A | 7/1998 | Chuang et al. | |
| 5,792,679 A | 8/1998 | Nakato | |
| 5,808,344 A | 9/1998 | Ismail et al. | |
| 5,821,577 A | 10/1998 | Crabbe' et al. | |
| 5,847,419 A | 12/1998 | Imai et al. | |
| 5,855,693 A | 1/1999 | Murari et al. | |
| 5,863,830 A | 1/1999 | Bruel et al. | |
| 5,877,070 A | 3/1999 | Goesele et al. | |
| 5,885,987 A | 3/1999 | Timmerman et al. | |
| 5,891,769 A | 4/1999 | Liaw et al. | |
| 5,906,951 A * | 5/1999 | Chu et al. | 438/751 |
| 5,912,479 A | 6/1999 | Mori et al. | |
| 5,923,046 A | 7/1999 | Tezuka et al. | |
| 5,943,560 A | 8/1999 | Chang et al. | |
| 5,951,757 A | 9/1999 | Dubbelday et al. | |
| 5,963,817 A | 10/1999 | Chu et al. | |
| 5,966,622 A | 10/1999 | Levine et al. | |
| 5,993,677 A | 11/1999 | Biasse et al. | |
| 5,998,807 A | 12/1999 | Lustig et al. | |
| 6,013,134 A | 1/2000 | Chu et al. | |
| 6,013,553 A | 1/2000 | Wallace et al. | |
| 6,013,563 A | 1/2000 | Henley et al. | |
| 6,020,252 A | 2/2000 | Aspar et al. | |
| 6,033,974 A | 3/2000 | Henley et al. | |
| 6,033,995 A | 3/2000 | Muller | |
| 6,058,044 A | 5/2000 | Suglura et al. | |
| 6,059,895 A | 5/2000 | Chu et al. | |
| 6,074,919 A | 6/2000 | Gardner et al. | |
| 6,096,590 A | 8/2000 | Chan et al. | |
| 6,103,559 A | 8/2000 | Gardner et al. | |
| 6,103,597 A | 8/2000 | Aspar et al. | |
| 6,103,599 A | 8/2000 | Henley et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,130,453 A | 10/2000 | Mei et al. | |
| 6,133,799 A | 10/2000 | Favors et al. | |
| 6,140,687 A | 10/2000 | Shimomura et al. | |
| 6,143,636 A | 11/2000 | Forbes et al. | |
| 6,153,495 A | 11/2000 | Kub et al. | |
| 6,154,475 A | 11/2000 | Soref et al. | |
| 6,160,303 A | 12/2000 | Fattaruso | |
| 6,162,688 A | 12/2000 | Gardner et al. | |
| 6,162,705 A | 12/2000 | Henley et al. | |
| 6,166,411 A * | 12/2000 | Buynoski | 257/347 |
| 6,184,111 B1 | 2/2001 | Henley et al. | |
| 6,190,998 B1 | 2/2001 | Bruel et al. | |
| 6,191,007 B1 | 2/2001 | Matsui et al. | |
| 6,191,432 B1 | 2/2001 | Sugiyama et al. | |
| 6,194,722 B1 | 2/2001 | Fiorini et al. | |
| 6,204,529 B1 | 3/2001 | Lung et al. | |
| 6,207,977 B1 | 3/2001 | Augusto | |
| 6,210,988 B1 | 4/2001 | Howe et al. | |
| 6,218,677 B1 | 4/2001 | Broekaert | |
| 6,225,192 B1 | 5/2001 | Aspar et al. | |
| 6,228,694 B1 | 5/2001 | Doyle et al. | |
| 6,232,138 B1 | 5/2001 | Fitzgerald et al. | |
| 6,235,567 B1 | 5/2001 | Huang | |
| 6,235,568 B1 | 5/2001 | Murthy et al. | |
| 6,242,324 B1 | 6/2001 | Kub et al. | |
| 6,249,022 B1 | 6/2001 | Lin et al. | |
| 6,251,751 B1 | 6/2001 | Chu et al. | |
| 6,251,755 B1 | 6/2001 | Furukawa et al. | |
| 6,261,929 B1 | 7/2001 | Gehrke et al. | |
| 6,266,278 B1 | 7/2001 | Harari et al. | |
| 6,271,551 B1 | 8/2001 | Schmitz et al. | |
| 6,271,726 B1 | 8/2001 | Fransis et al. | |
| 6,281,532 B1 | 8/2001 | Doyle et al. | |
| 6,290,804 B1 | 9/2001 | Henley et al. | |
| 6,291,321 B1 | 9/2001 | Fitzgerald | |
| 6,303,468 B1 | 10/2001 | Aspar et al. | |
| 6,313,016 B1 | 11/2001 | Kibbel et al. | |
| 6,316,301 B1 | 11/2001 | Kant | |
| 6,323,108 B1 | 11/2001 | Kub et al. | |
| 6,326,664 B1 | 12/2001 | Chau et al. | |
| 6,326,667 B1 | 12/2001 | Sugiyama et al. | |
| 6,329,063 B2 | 12/2001 | Lo et al. | |
| 6,335,546 B1 | 1/2002 | Tsuda et al. | |
| 6,339,232 B1 | 1/2002 | Takagi | |
| 6,344,417 B1 | 2/2002 | Usenko | |
| 6,346,459 B1 | 2/2002 | Usenko et al. | |
| 6,350,311 B1 | 2/2002 | Chin et al. | |
| 6,350,993 B1 | 2/2002 | Chu et al. | |
| 6,352,909 B1 | 3/2002 | Usenko | |
| 6,355,493 B1 | 3/2002 | Usenko | |
| 6,368,733 B1 | 4/2002 | Nishinaga | |
| 6,368,938 B1 | 4/2002 | Usenko | |

| Patent No. | Date | Inventor |
|---|---|---|
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,372,609 B1 | 4/2002 | Aga et al. |
| 6,387,829 B1 | 5/2002 | Usenko et al. |
| 6,391,740 B1 | 5/2002 | Cheung et al. |
| 6,399,970 B2 | 6/2002 | Kubo et al. |
| 6,403,975 B1 | 6/2002 | Brunner et al. |
| 6,407,406 B1 | 6/2002 | Tezuka |
| 6,410,371 B1 | 6/2002 | Yu et al. |
| 6,420,937 B1 | 7/2002 | Akatsuka et al. |
| 6,425,951 B1 | 7/2002 | Chu et al. |
| 6,429,061 B1 | 8/2002 | Rim |
| 6,445,016 B1 | 9/2002 | An et al. |
| 6,448,152 B1 | 9/2002 | Henley et al. |
| 6,455,397 B1 | 9/2002 | Belford |
| 6,458,672 B1 | 10/2002 | Henley et al. |
| 6,475,072 B1 | 11/2002 | Canaperi et al. |
| 6,489,639 B1 | 12/2002 | Hoke et al. |
| 6,500,694 B1 | 12/2002 | Enquist |
| 6,514,836 B2 | 2/2003 | Belford |
| 6,515,335 B1 | 2/2003 | Christiansen et al. |
| 6,521,041 B2 | 2/2003 | Wu et al. |
| 6,524,935 B1 | 2/2003 | Canaperi et al. |
| 6,534,380 B1 | 3/2003 | Yamauchi et al. |
| 6,534,381 B2 | 3/2003 | Cheung et al. |
| 6,555,839 B2 | 4/2003 | Fitzgerald |
| 6,563,152 B2 | 5/2003 | Roberds et al. |
| 6,573,126 B2 | 6/2003 | Cheng et al. |
| 6,583,015 B2 | 6/2003 | Fitzgerald et al. |
| 6,583,437 B2 | 6/2003 | Mizuno et al. |
| 6,591,321 B1 | 7/2003 | Armilli et al. |
| 6,593,191 B2 | 7/2003 | Fitzgerald |
| 6,593,625 B2 | 7/2003 | Christiansen et al. |
| 6,596,610 B1 | 7/2003 | Kuwabara et al. |
| 6,597,016 B1 | 7/2003 | Yuki et al. |
| 6,602,613 B1 | 8/2003 | Fitzgerald |
| 6,603,156 B2 | 8/2003 | Rim |
| 6,605,498 B1 | 8/2003 | Murthy et al. |
| 6,607,948 B1 | 8/2003 | Sugiyama et al. |
| 6,621,131 B2 | 9/2003 | Murthy et al. |
| 6,624,047 B1 | 9/2003 | Sakaguchi et al. |
| 6,624,478 B2 | 9/2003 | Anderson et al. |
| 6,632,724 B2 | 10/2003 | Henley et al. |
| 6,635,909 B2 | 10/2003 | Clark et al. |
| 6,645,831 B1 | 11/2003 | Shaheen et al. |
| 6,646,322 B2 | 11/2003 | Fitzgerald |
| 6,649,480 B2 | 11/2003 | Fitzgerald et al. |
| 6,649,492 B2 | 11/2003 | Chu et al. |
| 6,656,271 B2 | 12/2003 | Yonchara et al. |
| 6,657,223 B1 | 12/2003 | Wang et al. |
| 6,664,169 B1 | 12/2003 | Iwasaki et al. |
| 6,674,150 B2 | 1/2004 | Takagi et al. |
| 6,677,183 B2 | 1/2004 | Sakaguchi et al. |
| 6,677,192 B1 | 1/2004 | Fitzgerald |
| 6,680,240 B1 | 1/2004 | Maszara |
| 6,680,260 B2 | 1/2004 | Akiyama et al. |
| 6,689,211 B1 * | 2/2004 | Wu et al. ................. 117/94 |
| 6,690,043 B1 | 2/2004 | Usuda et al. |
| 6,703,144 B2 | 3/2004 | Fitzgerald |
| 6,703,648 B1 | 3/2004 | Xiang et al. |
| 6,703,688 B1 | 3/2004 | Fitzgerald |
| 6,706,614 B1 | 3/2004 | An et al. |
| 6,706,618 B2 | 3/2004 | Takisawa et al. |
| 6,707,106 B1 | 3/2004 | Wristers et al. |
| 6,709,903 B2 | 3/2004 | Christiansen et al. |
| 6,709,909 B2 | 3/2004 | Mizuno et al. |
| 6,713,326 B2 | 3/2004 | Cheng et al. |
| 6,723,661 B2 | 4/2004 | Fitzgerald |
| 6,730,551 B2 | 5/2004 | Lee et al. |
| 6,737,670 B2 | 5/2004 | Cheng et al. |
| 6,743,684 B2 | 6/2004 | Liu |
| 6,750,130 B1 | 6/2004 | Fitzgerald |
| 6,790,747 B2 | 9/2004 | Henley et al. |
| 6,828,214 B2 | 12/2004 | Notsu et al. |
| 6,890,835 B1 | 5/2005 | Chu et al. |
| 7,091,095 B2 | 8/2006 | Chu |
| 2001/0003664 A1 | 6/2001 | Yamaguchi |
| 2001/0007789 A1 | 7/2001 | Aspar et al. |
| 2002/0043660 A1 | 4/2002 | Yamazaki et al. |
| 2002/0063292 A1 | 5/2002 | Armstrong et al. |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0125471 A1 | 9/2002 | Fitzgerald et al. |
| 2002/0125497 A1 | 9/2002 | Fitzgerald |
| 2002/0167048 A1 | 11/2002 | Tweet et al. |
| 2002/0168864 A1 | 11/2002 | Cheng et al. |
| 2002/0190284 A1 | 12/2002 | Murthy et al. |
| 2003/0003679 A1 | 1/2003 | Doyle et al. |
| 2003/0013305 A1 | 1/2003 | Sugii et al. |
| 2003/0013323 A1 | 1/2003 | Hammond et al. |
| 2003/0027381 A1 | 2/2003 | Buynoski et al. |
| 2003/0034529 A1 | 2/2003 | Fitzgerald et al. |
| 2003/0057439 A1 | 3/2003 | Fitzgerald |
| 2003/0077867 A1 | 4/2003 | Fitzergald |
| 2003/0080361 A1 | 5/2003 | Murthy et al. |
| 2003/0102498 A1 | 6/2003 | Braithwaite et al. |
| 2003/0119280 A1 | 6/2003 | Lee et al. |
| 2003/0127646 A1 | 7/2003 | Christiansen et al. |
| 2003/0139000 A1 | 7/2003 | Bedell et al. |
| 2003/0141548 A1 | 7/2003 | Anderson et al. |
| 2003/0157787 A1 | 8/2003 | Murthy et al. |
| 2003/0160300 A1 | 8/2003 | Takenaka et al. |
| 2003/0178681 A1 | 9/2003 | Clark et al. |
| 2003/0189229 A1 | 10/2003 | Mouli |
| 2003/0199126 A1 | 10/2003 | Chu et al. |
| 2003/0201458 A1 | 10/2003 | Clark et al. |
| 2003/0203600 A1 | 10/2003 | Chu et al. |
| 2003/0207127 A1 | 11/2003 | Murthy et al. |
| 2003/0215990 A1 | 11/2003 | Fitzgerald et al. |
| 2003/0218189 A1 | 11/2003 | Christiansen et al. |
| 2003/0219957 A1 | 11/2003 | Kuwabara et al. |
| 2003/0227036 A1 | 12/2003 | Sugiyama et al. |
| 2003/0227057 A1 | 12/2003 | Lochtefeld et al. |
| 2003/0230778 A1 | 12/2003 | Park et al. |
| 2003/0232467 A1 | 12/2003 | Anderson et al. |
| 2004/0005740 A1 | 1/2004 | Lochtefeld et al. |
| 2004/0007715 A1 | 1/2004 | Webb et al. |
| 2004/0007724 A1 | 1/2004 | Murthy et al. |
| 2004/0009649 A1 | 1/2004 | Kub et al. |
| 2004/0012037 A1 | 1/2004 | Venkatesan et al. |
| 2004/0012075 A1 | 1/2004 | Bedell et al. |
| 2004/0014276 A1 | 1/2004 | Murthy et al. |
| 2004/0014304 A1 | 1/2004 | Bhattacharyya |
| 2004/0018699 A1 | 1/2004 | Boyd et al. |
| 2004/0031979 A1 | 2/2004 | Lochtefeld et al. |
| 2004/0031990 A1 | 2/2004 | Jin et al. |
| 2004/0041174 A1 | 3/2004 | Okihara |
| 2004/0041210 A1 | 3/2004 | Mouli |
| 2004/0048091 A1 | 3/2004 | Sato et al. |
| 2004/0048454 A1 | 3/2004 | Sakaguchi |
| 2004/0051140 A1 | 3/2004 | Bhattacharyya |
| 2004/0053477 A1 | 3/2004 | Ghyselen et al. |
| 2004/0070035 A1 | 4/2004 | Murthy et al. |
| 2004/0075149 A1 | 4/2004 | Fitzgerald et al. |
| 2004/0084735 A1 | 5/2004 | Murthy et al. |
| 2004/0119101 A1 | 6/2004 | Schrom et al. |
| 2004/0142545 A1 | 7/2004 | Ngo et al. |
| 2004/0173790 A1 | 9/2004 | Yeo et al. |
| 2004/0173815 A1 | 9/2004 | Yeo et al. |

FOREIGN PATENT DOCUMENTS

| | | |
|---|---|---|
| EP | 0 514 018 | 11/1992 |
| EP | 0 587 520 | 3/1994 |
| EP | 0 683 522 A2 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| FR | 2 701 599 | 9/1993 |
| GB | 2 342 777 | 4/2000 |
| JP | 2-210816 | 8/1990 |
| JP | 3-036717 | 2/1991 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-094420 | 4/1995 |
| JP | 7-106446 | 4/1995 |
| JP | 7-240372 | 9/1995 |
| JP | 61-141116 | 6/1996 |
| JP | 9-219524 | 8/1997 |
| JP | 10-270685 | 10/1998 |
| JP | 11-233744 | 8/1999 |
| JP | 2000-021783 | 1/2000 |
| JP | 2000-31491 | 1/2000 |
| JP | 2001-319935 | 11/2001 |
| JP | 2002-076334 | 3/2002 |
| JP | 2002-164520 | 6/2002 |
| JP | 2002-289533 | 10/2002 |
| WO | WO 98/59365 | 12/1998 |
| WO | WO 99/53539 | 10/1999 |
| WO | WO 00/48239 | 8/2000 |
| WO | WO 00/54338 | 9/2000 |
| WO | WO 01/22482 | 3/2001 |
| WO | WO 01/54202 | 7/2001 |
| WO | WO 01/93338 | 12/2001 |
| WO | WO 01/99169 | 12/2001 |
| WO | WO 02/13262 | 2/2002 |
| WO | WO 02/15244 | 2/2002 |
| WO | WO 02/27783 | 4/2002 |
| WO | WO 02/47168 | 6/2002 |
| WO | WO 02/071488 | 9/2002 |
| WO | WO 02/071491 | 9/2002 |
| WO | WO 02/071495 | 9/2002 |
| WO | WO 02/082514 | 10/2002 |
| WO | WO 2004/006311 | 1/2004 |
| WO | WO 2004/006326 | 1/2004 |
| WO | WO 2004/006327 | 1/2004 |
| WO | WO 2004/019403 | 3/2004 |
| WO | WO 2004/019404 | 3/2004 |

OTHER PUBLICATIONS

Armstrong et al, "Design of Si/SiGe Heterojunction Complementary Metal-Oxide-Semiconductor Transistors," IEDM Technical Digest (1995 International Electron Devices Meeting) pp. 761-764.

Armstrong, "Technology for SiGe Heterostructure-Based CMOS Devices," Thesis Submitted to the Massachusetts Institute of Technology Department of Electrical Engineering and Computer Science on Jun. 30, 1999, pp. 1-154.

Augusto et al., "Proposal for a New Process Flow for the Fabrication of Silicon-based Complementary MOD-MOSFETs without ion Implantation," Thin Solid Films, vol. 294, No. 1-2, pp. 254-258 (Feb. 15, 1997).

Barradas et al., "RBS analysis of MBE-grown SiGe/(001) Si heterostructures with thin, high Ge content SiGe channels for HMOS transistors," Modern Physics Letters B (2001) (abstract).

Borenstein et al., "A New Ultra-Hard Etch-Stop Layer for High Precision Micromachining," Proceedings of the 1999 12$^{th}$ IEEE International Conference on Micro Electro Mechanical System (MEMs), (Jan. 17-21, 1999) pp. 205-210.

Bouillon et al., "Search for the optimal channel architecture for 0.18/0.12 μm bulk CMOS Experimental study," IEEE, (1996) pp. 21.2.1-21.2.4.

Bruel et al., "® Smart Cut: A Promising New SOI Material Technology," Proceedings 1995 IEEE International SOI Conference (Oct. 1995) pp. 178-179.

Bruel, "Silicon on Insulator Material Technology," Electronic Letters, vol. 13, No. 14 (Jul. 6, 1995) pp. 1201-1202.

Brunner et al., "Molecular beam epitaxy growth and thermal stability of $Si_{1-x}Ge_x$ layers on extremely thin silicon-on-insulator substrates," Thin Solid Films, vol. 321 (1998) pp. 245-250.

Bufler et al., "Hole transport in strained Si1-xGex alloys on Si1-yGey substrates," Journal of Applied Physics, vol. 84, No. 10 (Nov. 15, 1998) pp. 5597-5602.

Burghartz et al., "Microwave Inductors and Capacitors in Standard Multilevel Interconnect Silicon Technology", IEEE Transactions on Microwave Theory and Techniques, vol. 44, No. 1, Jan. 1996, pp. 100-104.

Carlin et al., "High Efficiency GaAs-on-Si Solar Cells with High Voc Using Graded GeSi Buffers," IEEE (2000) pp. 1006-1011.

Chang et al., "Selective Etching of SiGe on SiGe//Si Heterostructures," Journal of the Electrochemical Society, vol. 138, No. 1 (Jan. 1991) pp. 202-204.

Chen et al., "The Band Model and the Etching Mechanism of Silicon in Aqueous KOH," J. Electrochem. Soc., vol. 142, No. 1 (Jan. 1995) pp. 170-176.

Cheng et al., "Relaxed Silicon-Germanium on Insulator Substrate by Layer Transfer," Journal of Electronic Materials, vol. 30, No. 12 (2001) pp. L37-L39.

Cullis et al, "Growth ripples upon strained SiGe epitaxial layers on Si and misfit dislocation interactions," Journal of Vacuum Science and Technology A, vol. 12, No. 4 (Jul./Aug. 1994) pp. 1924-1931.

Currie et al., "Controlling Threading Dislocation in Ge on Si Using Graded SiGe Layers and Chemical-Mechanical Polishing," vol. 72 No. 14, p. 1718-1720, Feb. 1998.

Currie et al., "Carrier mobilities and process stability of strained S in- and p-MOSFETs on SiGe virtual substrates," J. Vac. Sci. Technol. B., vol. 19, No. 6 (Nov./Dec. 2001) pp. 2268-2279.

Eaglesham et al., "Dislocation-Free Stranski-Krastanow Growth of Ge on Si(100)," Physical Review Letters, vol. 64, No. 16 (Apr. 16, 1990) pp. 1943-1946.

Feijoo et al., "Epitaxial Si-Ge Etch Stop Layers with Ethylene Diamine Pyrocatechol for Bonded and Etchback Silicon-on-Insulator," Journal of Electronic Materials, vol. 23, No. 6 (1994) pp. 493-496.

Finne et al., "A Water-Amine-Complexing Agent System for Etching Silicon," J. Electrochem. Soc., vol. 114, No. 9 (Sep. 1967) pp. 965-970.

Fischetti et al., "Band structure, deformation potentials, and carrier mobility in strained Si, Ge, and SiGe alloys," J. Appl. Phys., vol. 80, No. 4 (Aug. 15, 1996) pp. 2234-2252.

Fischetti, "Long-range Coulomb interactions in small Si devices. Part II. Effective electronmobility in thin-oxide structures," Journal of Applied Physics, vol. 89, No. 2 (Jan. 15, 2001) pp. 1232-1250.

Fitzgerald et al., "Dislocation dynamics in relaxed graded composition semiconductors," Materials Science and Engineering B67, (1999) pp. 53-61.

Fitzgerald et al., "Relaxed $Ge_xSi_{1-x}$ structures for III-V integration with Si and high mobility two-dimensional electron gases in Si," J. Vac. Sci. Technol. B, vol. 10, No. 4 (Jul./Aug. 1992) pp. 1807-1819.

Fukatsu "SiGe-based semiconductor-on-insulator substrate created by low-energy separation-by-implanted-oxygen," Applied Physics Letters, vol. 72, No. 26 (Jun. 29, 1998) pp. 3485-3487.

Garone et al., "Silicon-vapor phase epitaxial growth catalysis by the presence of germane," Applied Physics Letters, vol. 56, No. 13 (Mar. 26, 1990) pp. 1275-1277.

Godbey et al., (1990) "Fabrication of Bond and Etch-Back Silicon Insulator Using a Strained SI0.7GE0.3 Layer as an Etch Stop," Journal of the Electrical Society, vol. 137, No. 10 (Oct. 1990) pp. 3219-3223.

Godbey et al., "A Si$_{0.7}$Ge$_{0.3}$ strained-layer etch stop for the generation of thin layer undoped silicon," *Appl. Phys. Lett.*, vol. 56 No. 4 (Jan. 22, 1990) pp. 373-375.

Gray and Meyer, "Analysis and Design of Analog Integrated Circuits", John Wiley & Sons, 1984, pp. 605-632.

Grillot et al., "Acceptor diffusion and segregation in (AlxGa1-x)0.5In0.5P heterostructures", Journal of Applied Physics, vol. 91, No. 8, Apr. 2002, pp. 4891-4899.

Grützmacher et al., "Ge segregation in SiGe/Si heterostructures and its dependence on deposition technique and growth atmosphere," Applied Physics Letters, vol. 63, No. 18 (Nov. 1, 1993) pp. 2531-2533.

Hackbarth et al., "Alternatives to thick MBE-grown relaxed SiGe buffers," *Thin Solid Films*, vol. 369 (Jul. 2000) pp. 148-151.

Hackbarth et al., "Strain relieved SiGe buffers for Si-based heterostructure field-effect transistors," Journal of Crystal Growth, vol. 201/202 (1999) pp. 734-738.

Halsall et al., "Electron diffraction and Raman studies of the effect of substrate misorientation on ordering in the AlGaInP system," Journal of Applied Physics, vol. 85, No. 1, Jan. 1999, pp. 199-202.

Herzog et al., "SiGe-based FETs: buffer issues and device results," Thin Solid Films, vol. 380 (2000) pp. 36-41.

Höck et al., "Carrier mobilities in modulation doped Si 1-xGex heterostructures with respect to FET applications," Thin Solid Films, vol. 336 (1998) pp. 141-144.

Höck et al., "High hole mobility in Si0.17 Ge0.83 channel metal-oxide-semiconductor field-effect transistors grown by plasma-enhanced chemical vapor deposition," Applied Physics Letters, vol. 76, No. 26 (Jun. 26, 2000) pp. 3920-3922.

Höck et al., "High performance 0.25 µm p-type Ge/SiGe MODFETs," Electronics Letters, vol. 34, No. 19 (Sep. 17, 1998) pp. 1888-1889.

Hsu et al., "Surface Morphology of related GexSi1-x films", Appl. Phys. Lett., vol. 61 No. 11, Sep. 1992, pp. 1293-1295.

Huang et al., (2001) "Carrier Mobility enhancement in strained Si-on-insulator fabricated by wafer bonding", 2001 Symposium on VLSI Technology, Digest of Technical Papers, pp. 57-58.

Huang et al., "High-quality strain-relaxed SiGe alloy grown on implanted silicon-on-insulator substrate," *Applied Physics Letters*, vol. 76, No. 19 (May 8, 2000) pp. 2680-2682.

Huang et al., "The Impact of Scaling Down to Deep Submicron on CMOS RF Circuits", IEEE Journal of Solid-State Circuits, vol. 33, No. 7, Jul. 1998, pp. 1023-1036.

IBM Technical Disclosure Bulletin, vol. 35, No. 4B (Sep. 1992), "2 Bit/Cell EEPROM Cell Using Band to Band Tunneling for Data Read-Out," pp. 136-140.

IBM Technical Disclosure Bulletin, vol. 32, No. 8A (Jan. 1990) "Optimal Growth Technique and Structure for Strain Relaxation of Si-Ge Layers on Si Substrates", pp. 330-331.

Ishikawa et al., "Creation of Si-Ge-based SIMOX structures by low energy oxygen implantation," *Proceedings 1997 IEEE International SOI Conference* (Oct. 1997) pp. 16-17.

Ishikawa et al., "SiGe-on-insulator substrate using SiGe alloy grown Si(001)," *Applied Physics Letters*, vol. 75, No. 7 (Aug. 16, 1999) pp. 983-985.

Ismail et al., "Modulation-doped n-type Si/SiGe with inverted interface," Appl. Phys. Lett., vol. 65, No. 10 (Sep. 5, 1994) pp. 1248-1250.

Ismail, "Si/SiGe High-Speed Field-Effect Transistors," *Electron Devices Meeting* (Dec. 10, 1995 pp. 20.1.1-20.1.4..

Kearney et al., "The effect of alloy scattering on the mobility of holes in a Si$_{1-x}$Gex quantum well," Semicond. Sci. Technol., vol. 13, (1998) pp. 174-180.

Kim et al., "A Fully Integrated 1.9-GHz CMOS Low-Noise Amplifier", IEEE Microwave and Guided Wave Letters, vol. 8, No. 8, Aug. 1998, pp. 293-295.

Koester et al., "Extremely High Transconductance Ge/Si0.4Ge0.6 p-MODFET's Grown by UHV-CVD," IEEE Electron Device Letters, vol. 21, No. 3 (Mar. 2000) pp. 110-112.

König et al., "Design Rules for n-Type SiGe Hetero FETs," *Solid State Electronics*, vol. 41, No. 10 (1997), pp. 1541-1547.

König et al., "p-Type Ge-Channel MODFET's with High Transconductance Grown on Si Substrates," IEEE Electron Device Letters, vol. 14, No. 4 (Apr. 1993) pp. 205-207.

König et al., "SiGe HBTs and HFETs," Solid-State Electronics, vol. 38, No. 9 (1995) pp. 1595-1602.

Kuznetsov et al., "Technology for high-performance n-channel SiGe modulation-doped field-effect transistors," J. Vac. Sci. Technol., B 13(6), pp. 2892-2896 (Nov./Dec. 1995).

Langdo et al., (2002) "Preparation of Novel SiGe-free Strained Si on Insulator Substrates" IEEE International SOI Conference, pp. 211-212 (XP002263057).

Larson, "Integrated Circuit Technology Options for RFIC's□Present Status and Future Directions", IEEE Journal of Solid-State Circuits, vol. 33, No. 3, Mar. 1998, pp. 387-399.

Leancu et al., "Anisotropic etching of germanium," *Sensors and Actuators A*, vol. 46-47 (1995) pp. 35-37.

Lee and Wong, "CMOS RF Integrated Circuits at 5 GHz and Beyond", Proceedings of the IEEE, vol. 88, No. 10, Oct. 2000, pp. 1560-1571.

Lee et al., "Strained Ge channel p-type metal-oxide-semiconductor field-effect transistors grown on Si1-xGex/Si virtual substrates," Applied Physics Letters, vol. 79, No. 20 (Nov. 12, 2001) pp. 3344-3346.

Lee et al., "Strained Ge channel p-type MOSFETs fabricated on Si1-xGex/Si virtual substrates," Mat. Res. Soc. Symp. Proc., vol. 686 (2002) pp. A1.9.1-A1.9.5.

LeGoues et al., "Relaxation of SiGe Thin films grown on Si/SiO$_2$ substrates," *Appl. Phys. Lett.*, vol. 75, No. 11 (Jun. 1, 1994) pp. 7240-7246.

Leitz et al., "Channel Engineering of SiGe-Based Heterostructures for High Mobility MOSFETs," Mat. Res. Soc. Symp. Proc., vol. 686 (2002) pp. A3.10.1-A3.10.6.

Leitz et al., "Dislocation glide and blocking kinetics in compositionally graded SiGe/Si," *Journal of Applied Physics*, vol. 90, No. 6 (Sep. 15, 2001) pp. 2730-2736.

Leitz et al., "Hole mobility enhancements in strained Si/Si1-yGey p-type metal-oxide-semiconductor field-effect transistors grown on relaxed Si1-xGex (x<y) virtual substrates," Applied Physics Letters, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," J. Vac. Sci. Technol., A vol. 20 No. 3 (May/Jun. 2002) pp. 1030-1033.

Lu et al., "High Performance 0.1 □m Gate-Length P-Type SiGe MODFET's and MOS-MODFET's", IEEE Transactions on Electron Devices, vol. 47, No. 8, Aug. 2000, pp. 1645-1652.

M. Kummer et al., "Low energy plasma enhanced chemical vapor deposition," Materials Science and Engineering B89 (2002) pp. 288-295.

Maiti et al., "Strained-Si heterostructure field effect transistors," *Semicond. Sci. Technol.*, vol. 13 (1998) pp. 1225-1246.

Maszara, "Silicon-On-Insulator by Wafer Bonding: A Review," *Journal of the Electrochemical Society*, vol. 138, No. 1 (Jan. 1991) pp. 343-347.

Meyerson et al., "Cooperative Growth Phenomena in Silicon/Germanium Low-Temperature Epitaxy," Applied Physics Letters, vol. 53, No. 25 (Dec. 19, 1988) pp. 2555-2557.

Mizuno et al., "Advanced SOI-MOSFETs with Strained-SI Channel for High Speed CMOS-Electron/Hole Mobility Enhancement," 2002 Symposium on VLSI Technology, Digest of Technical Papers, Honolulu, (Jun. 13-15), IEEE New York, NY, pp. 210-211.

Mizuno et al., "Electron and Hold Mobility Enhancement in Strained-Si MOSFET's on SiGe-on-Insulator Substrates Fabricated by SIMOX Technology," *IEEE Electron Device Letters*, vol. 21, No. 5 (May 2000) pp. 230-232.

Mizuno et al., "High Performance Strained-Si p-MOSFETs on SiGe-on-Insulator Substrates Fabricated by SIMOX Technology," IEEE IDEM Technical Digest, (1999 International Electron Device Meeting) pp. 934-936.

Narozny et al., "Si/SiGe Heterojunction Bipolar Transistor with Graded GAP SiGe Base Made by Molecular Beam Epitaxy," *IEEE IEDM* (1988) pp. 562-565.

Nayak et al., "High-Mobility Strained-Si PMOSFET's"; IEEE Transactions on Electron Devices, vol. 43, No. 10, Oct. 1996, pp. 1709-1716.

O'Neill et al., "SiGe Virtual substrate N-channel heterojunction MOSFETS," Semicond. Sci. Technol., vol. 14 (1999) pp. 784-789.

Ota, Y. et al..; "Application of heterojunction FET to power amplifier for cellular telephone," Electronic Letters, IEE Stevanage, GB, vol. 30 No. 11, May 26, 1994, pp. 906-907.

Papananos, "Radio-Frequency Microelectronic Circuits for Telecommunication Applications", Kluwer Academic Publishers, 1999, pp. 115-117, 188-193.

Parker et al., "SiGe heterostructure CMOS circuits and applications," Solid State Electronics, vol. 43 (1999) pp. 1497-1506.

Powell et al., "New approach to the growth of low dislocation relaxed SiGe material," *Appl. Phys. Lett.*, vol. 64, No. 14 (Apr. 4, 1994) pp. 1865-1858.

Ransom et al., "Gate-Self-Aligned n-channel and p-channel Germanium MOSFET's," IEEE Transactions on Electron Devices, vol. 38, No. 12 (Dec. 1991) pp. 2695.

Reinking et al., "Fabrication of high-mobility Ge p-channel MOSFETs on Si substrates," Electronics Letters, vol. 35, No. 6 (Mar. 18, 1999) pp. 503-504.

Rim et al, "Fabrication and Analysis of Deep Submicron Strained-Si N-MOSFET's," *IEEE Transactions on Electron Devices*, vol. 47, No. 7 (Jul. 2000) pp. 1406-1415.

Rim et al., "Enhanced Hole Mobilities in Surface-channel Strained-Si p-MOSFETs"; IEDM, 1995, pp. 517-520.

Rim, "Application of Silicon-Based Heterostructures to Enhanced Mobility Metal-Oxide-Semiconductor Field-Effect Transistors", PhD Thesis, Stanford University, 1999; pp. 1-184.

Robbins et al., "A model for heterogeneous growth of Si1-xGex films for hydrides," Journal of Applied Physics, vol. 69, No. 6 (Mar. 15, 1991) pp. 3729-3732.

Sadek et al., "Design of Si/SiGe Heterojunction Complementary Metal-Oxide-Semiconductor Transistors," *IEEE Trans. Electron Devices*, vol. 43, No. 8 (Aug. 1996) pp. 1224-1232.

Sakaguchi et al., "ELTRAN by splitting porous si layers," Proc. 195th Int. SOI Syposium, vol. 99-3, pp. 117-121, Electrochemical Society, (1999).

Schäffler, "High-Mobility Si and Ge Structures," Semiconductor Science and Technology, vol. 12 (1997) pp. 1515-1549.

Seidel et al., "Anisotropic Etching of Crystalline Silicon in Alkaline Solutions," *J. Electrochem. Soc.*, vol. 137, No. 11 (Nov. 1990) pp. 3626-3632.

Shang et al., "The Development of an Anisotropic Si Etch Process Selective to $Ge_xSi_{1-x}$ Underlayers," *J. Electrochem. Soc.*, vol. 141, No. 2 (Feb. 1994) pp. 507-510.

Sugimoto and Ueno, "A 2V, 500 MHz and 3V, 920 MHz Low-Power Current-Mode 0.6 □m CMOS VCO Circuit", IEICE Trans. Electron., vol. E82-C, No. 7, Jul. 1999, pp. 1327-1329.

Takagi et al., "On the Universality of Inversion Layer Mobility in Si MOSFET's: Part 1-Effects of Substrate Impurity Concentration," *IEEE Transactions on Electron Devices*, vol. 41, No. 12 (Dec. 1994) pp. 2357-2362.

Ternent et al., "Metal Gate Strained Silicon MOSFETs for Microwave Integrated Circuits", IEEE Oct. 2000, pp. 38-43.

Tsang et al., "Measurements of alloy composition and strain in thin GexSi1-x layers," J. Appl. Phys., vol. 75 No. 12 (Jun. 15, 1994) pp. 8098-8108.

Tweet et al., "Factors determining the composition of strained GeSi layers grown with disilane and germane," Applied Physics Letters, vol. 65, No. 20 (Nov. 14, 1994) pp. 2579-2581.

Usami et al., "Spectroscopic study of Si-based quantum wells with neighboring confinement structure," *Semicon. Sci. Technol.* (1997), vol. 12, pp. 1596-1602.

Welser et al., "Electron Mobility Enhancement in Strained-Si N-Type Metal-Oxide-Semiconductor Field-Effect Transistors," IEEE Electron Device Letters, vol. 15, No. 3 (Mar. 1994) pp. 100-102.

Welser et al., "Evidence of Real-Space Hot-Electron Transfer in High Mobility, Strained-Si Multilayer MOSFETs," IEEE IDEM Technical Digest (1993 International Electron Devices Meeting) pp. 545-548.

Welser et al., "NMOS and PMOS Transistors Fabricated in Strained Silicon/Relaxed Silicon-Germanium Structures," IEEE IDEM Technical Digest (1992 International Electron Devices Meeting) pp. 1000-1002.

Welser, "The Application of Strained Silicon/Relaxed Silicon Germanium Heterostructures to Metal-Oxide-Semiconductor Field-Effect Transistors," PhD Thesis, Stanford University, 1994, pp. 1-205.

Wolf and Tauber, Silicon Processing for the VLSI Era, vol. 1: Process Technology, Lattice Press, Sunset Beach, CA, pp. 384-386 (1986).

Wu, "Novel Etch-Stop Materials for Silicon Micromachining," Thesis Submitted to the Massachusetts Institute of Technology Department of Materials Science and Engineering on May 9, 1997, pp. 1-62.

Xie et al., "Semiconductor Surface Roughness: Dependence on Sign and Magnitude of Bulk Strain," The Physical Review Letters, vol. 73, No. 22 (Nov. 28, 1994) pp. 3006-3009.

Xie et al., "Very high mobility two-dimensional hole gas in Si/GexSi1-x/Ge structures grown by molecular beam epitaxy," Appl. Phys. Lett., vol. 63, No. 16 (Oct. 18, 1993) pp. 2263-2264.

Xie, "SiGe Field effect transistors," Materials Science and Engineering, vol. 25 (1999) pp. 89-121.

Yamagata et al., Bonding, Splitting and Thinning by Porous Si in ELTRAN; SOI-Epi Wafer, Mat.Res.Soc.Symp.Proc. vol. 681E 2001 Materials Research Society, pp. 18.2.1-18.2.10.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000) pp. 161-163.

Yi et al., "$Si_{1-x}Ge_x$/Si Multiple Quantum Well Wires Fabricated Using Selective Etching," *Mat. Res. Soc. Symp. Proc.*, vol. 379 (1995) pp. 91-96.

Zhang et al., "Demonstration of a GaAs-Based Compliant Substrate Using Wafer Bond ing and Substrate Removal Techniques," Electronic Materials and Processing Research Laboratory, Department of Electrical Engineering, University Park, PA 16802 (1998) pp. 25-28.

Al-Bayati et al., "Exploring the limits of pre-amorphization implants on controlling channeling and diffusion of low energy B implants and ultra shallow junction formation," 2000 Conf. on Ion Implantation Technology, pp. 54-57.

Andrieu et al., "Co-integrated Dual Strained Channels on Fully Depleted sSDOI CMOSFETs with $HfO_2$/TiN Gate Stack down to 15 nm Gate Length," 2005 IEEE Int'l SOI Conf. Proc.

Batterman, "Hillocks, Pits, and Etch Rate in Germanium Crystals," Journal of Applied Physics, vol. 28, No. 11 (Nov. 1957), pp. 1236-1241.

Bohg, "Ethylene Diamine-Pyrocatechol-Water Mixture Shows Etching Anomaly in Boron-Doped Silicon," Journal of the Electrochemical Society, vol. 118, No. 2 (Feb. 1971), pp. 401-402.

Canaperi, et al., "Preparation of a relaxed Si-Ge layer on an insulator in fabricating high-speed semiconductor devices with strained epitaxial firms," IBM, USA (2002) (abstract only).

Desmond et al., "The Effects of Process-Induced Defects on the Chemical Selectivity of the Chemical Selectivity of Highly Doped Boron Etch Stops in Silicon," Journal of the Electrochemical Society, vol. 141, No. 1 (Jan. 1994), pp. 178-184.

Examination Report for European Patent Application No. 01 973 651.1, dated Sep. 7, 2005, 4 pages.

Examination Report for European Patent Application No. 01 973 651.1-1528, dated Mar. 22, 2004, 3 pages.

Examination Report for European Patent Application No. 01 973 651.1-1528, dated Nov. 12, 2004, 9 pages.

Examination Report for European Patent Application No. 01 989 893.1-1235, dated Aug. 16, 2004, 5 pages.

Examination Report for European Patent Application No. 02 709 406.9-2203, dated Mar. 24, 2005, 5 pages.

Examination Report for European Patent Application No. 02 709 406.9-2203, dated May 11, 2004, 3 pages.

Examination Report for European Patent Application No. 98 931 529.6-2203, dated Jan. 10, 2002, 4 pages.

Examination Report for European Patent Application No. 98 931 529.6-2203, dated May 9, 2003, 5 pages.

Feijóo et al., "Etch Stop Barriers in Silicon Produced by Ion Implantation of Electrically Non-Active Species," Journal of the Electrochemical Society, vol. 139, No. 8 (Aug. 1992), pp. 2309-2314.

Fitzgerald et al., "Dislocations in Relaxed SiGe/Si Heterostructures," Physica Status Solidi A, Applied Research, Berlin, DE, vol. 171, Nr. 1, p. 227-238, Jan. 16, 1999.

Fitzgerald et al., "Totally Relaxed $Ge_xSi_{1-x}$ Layers with Low Threading Dislocation Densities Grown on Si Substrates," Applied Physics Letters, vol. 59, No. 7 (Aug. 12, 1991) pp. 811-813.

Fitzgerald, "GeSi/Si Nanostructures," Annual Review of Materials Science, vol. 25 (1995), pp. 417-454.

Frank, "Orientation-Dependent Dissolution of Germanium," Journal of Applied Physics, vol. 31, No. 11 (Nov. 1960), pp. 1996-1999.

Gannavaram et al., "Low Temperature ($\leq 800°$ C) Recessed Junction Selective Silicon-Germanium Source/Drain Technology for sub-70 nm CMOS," IEEE IEDM Technical Digest (2000), pp. 437-440.

Ge et al., "Process-Strained Si (PSS) CMOS Technology Featuring 3D Strain Engineering," IEEE IEDM Technical Digest, (2003) pp. 73-76.

Ghandi et al., "Chemical Etching of Germanium," Journal of the Electrochemical Society, vol. 135, No. 8 (Aug. 1988), pp. 2053-2054.

Ghani et al., "A 90nm High Volume Manufacturing Logic Technology Featuring Novel 45nm Gate Length Strained Silicon CMOS Transistors," IEEE IEDM Technical Digest (2003), 978-980.

Hamada et al., "A New Aspect of Mechanical Stress Effects in Scaled MOS Devices," IEEE Transactions on Electron Devices, vol. 38, No. 4 (Apr. 1991), pp. 895-900.

Herzog et al., "X-Ray Investigation of Boron- and Germanium-Doped Silicon Epitaxial Layers," Journal of the Electrochemical Society, vol. 131, No. 12 (Dec. 1984), pp. 2969-2974.

Holmes, "The Orientation Dependence of Etching Effects of Germanium Crystals," Acta Metallurgica, vol. 7, No. 4 (Apr. 1959), pp. 283-290.

Huang et al., "Isolation Process Dependence of Channel Mobility in Thin-Film SOI Devices," IEEE Electron Device Letters, vol. 17, No. 6 (Jun. 1996), pp. 291-293.

Huang et al., "LOCOS-Induced Stress Effects on Thin-Film SOI Devices," IEEE Transactions on Electron Devices, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", IEEE Electron Device Letters, vol. 21, No. 9, (Sep. 2000) pp. 448-450.

Hunt et al., "Highly Selective Etch Stoop by Stress Compensation for Thin-Film BESOI," 1990 IEEE/SOI Technology Conference, (Oct. 2-4, 1990), pp. 145-146.

Iida et al., "Thermal behavior of residual strain in silicon-on-insulator bonded wafer and effects on electron mobility," Solid-State Electronics, vol. 43 (1999), pp. 1117-1120.

International Search Report for Int'l Application No. PCT/US01/46322, mailed Jan. 22, 2003.

International Search Report for Patent Application No. PCT/US98/13076, dated Oct. 27, 1998, 2 pages.

International Search Report for Related International Application No. PCT/US2003/18007, Jan. 5, 2004.

Ito et al., "Mechanical Stress Effect on Etch-Stop Nitride and its Impact on Deep Submicron Transistor Design," IEEE IEDM Technical Digest (2000), pp. 247-250.

Jaccodine, "Use of Modified Free Energy Theorems to Predict Equilibrium Growing and Etching Shapes," Journal of Applied Physics, vol. 33, No. 8 (Aug. 1962), pp. 2643-2647.

Kern, "Chemical Etching of Silicon, Germanium, Gallium, Arsenide, and Gallium Phosphide," RCA Review, vol. 39 (Jun. 1978), pp. 278-308.

Klauk et al., "Thermal stability of undoped strained Si channel SiGe heterostructures," American Institute of Physics, Apr. 1, 1996, pp. 1975-1977, Appl. Phys. Lett., vol. 68, No. 14.

Kubota M., et al. "New SOI CMOS Proess with Selective Oxidation," IEEE IEDM Tech. Dig., pp. 814-816 (1986).

Lang et al., "Bulk Micromachining of Ge for IR Gratings," Journal of Micromechanics and Microengineering, vol. 6, No. 1 (Mar. 1996), pp. 46-48.

Lehmann et al., "Implanted Carbon: An Effective Etch-Stop in Silicon," Journal of the Electrochemical Society, vol. 138, No. 5 (May 1991), pp. 3-4.

Lochtefeld et al., "Investigating the Relationship Between Electron Mobility and Velocity in Deeply Scaled NMOS via Mechanical Stress," IEEE Electron Device Letters, vol. 22, No. 12 (2001), pp. 591-593.

Ming et al., "Interfacial roughness scaling and strain in lattice mismatched Si0.4 Ge0.6 thin films on Si," Applied Physics Lettters, vol. 67, No. 5, Jul. 31, 1995, pp. 629-631.

Ming et al., "Microscopic structure of interfaces in $Si_{1-x}Ge_x$/Si heterostructures and superlattices studied by x-ray scattering and fluorescence yield," Physical Review B, vol. 47, No. 24, pp. 373-381, Jun. 15, 1993.

Nishi et al. "Handbook of Semiconductor Manufacturing Technology," Marcel Dekker AG, New York, NY, 2000 pp. 1-22.

Notice of Final Rejection for Korean Patent Application No. 10-1999-7012279, dated Feb. 25, 2003 2 pages (English translation attached).

Notice of Preliminary Rejection for Korean Patent Application No. 10-1999-7012279, dated Feb. 21, 2002, 2 pages (English translation attached).

O'Neill, et al., "Deep Submicron CMOS Based on Silicon Germanium Technology," Fellow, IEEE Transactions on Electron Devices, vol. 43, No. 6, Jun. 1996 pp. 911-918.

Ootsuka et al., "A Highly Dense, High-Performance 130nm node CMOS Technology for Large Scale System-on-a-Chip Applications," IEEE IEDM Technical Digest (2000), pp. 575-578.

Ota et al., "Novel Locally Strained Channel Technique for High Performance 55nm CMOS," IEEE IEDM Technical Digest (2002), pp. 27-30.

Palik et al., "Ellipsometric Study of the Etch-Stop Mechanism in Heavily Doped Silicon," Journal of the Electrochemical Society, vol. 132, No. 1 (Jan. 1985), pp. 135-141.

Palik et al., "Study of Bias-Dependent Etching of Si in Aqueous KOH," Journal of the Electrochemical Society, vol. 134, No. 2 (Feb. 1987), pp. 404-409.

Palik et al., "Study of the Etch-Stop Mechanism in Silicon," Journal of the Electrochemical Society, vol. 129, No. 9 (Sep. 1982), pp. 2051-2059.

Partial International Search Report for Internation Patent Application No. PCT/US2006/035814, Feb. 7, 2007 (7 pages).

Rai-Choudhury et al., "Doping of Epitaxial Silicon," Journal of Crystal Growth, vol. 7 (1970), pp. 361-367.

Raley et al., "(100) Silicon Etch-Rate Dependence on Boron Concentration in Ethylenediamine-Pyrocatechol-Water Solutions," Journal of the Electrochemical Society, vol. 131, No. 1 (Jan. 1984), pp. 161-171.

Rosenblad et al., "Strain relaxation of graded SiGe buffers grown at very high rates," Materials Science and Engineering B, vol. 71, Nr. 1-3, p. 20-23 (Feb. 2000).

Senna et al., "Gallium Doping for Silicon Etch Stop in KOH," Transducers '95/Eurosensors IX, the 8th International Conference on Solid-State Sensors and Actuators and Eurosensors IX, Stockholm, Sweden, Jun. 25-29, 1995, pp. 194-195.

Shimizu et al., "Local Mechanical-Stress Control (LMC): A New Technique for CMOS-Performance Enhancement," IEEE IEDM Technical Digest (2001), pp. 433-436.

Soderbarg, "Fabrication of BESOI-Materials Using Implanted Nitrogen as an Effective Etch Stop Barrier," 1989 IEEE SOS/SOI Tech. Conf., pp. 64.

Sundaram et al., "Electrochemical etching of Silicon by Hydrazine," Journal of the Electrochemical Society, vol. 140, No. 6 (Jun. 1993), pp. 1592-1597.

Thean et al., "Performance of super-critical strained-si directly on insulator (SC-SSOI) CMOS based on high-performance PD-SOI technology," 2005 Symp. on VLSI Tech., Dig. Tech. Papers, pp. 134-135.

Thompson et al., "A 90 nm Logic Technology Featuring 50nm Strained-Silicon Channel Transistors, 7 layers of Cu Interconnects, Low k ILD, and 1um² SRAM Cell," IEEE IEDM Technical Digest (2002), pp. 61-64.

Thompson et al., "A Logic Nanotechnology Featuring Strained-Silicon," IEEE Electron Device Letters, vol. 25, No. 4 (Apr. 2004), pp. 191-193.

Tiwari et al., "Hole Mobility Improvement in Silicon-on-Insulator and Bulk Silicon Transistors Using Local Strain," IEEE IEDM Technical Digest (1997), pp. 939-941.

Uchino, et al., "A Raised Source/Drain Technology Using In-situ P-doped SiGe and B-doped Si for 0.1-μm CMOS ULSIs," IEEE IEDM Technical Digest (1997), pp. 479-482.

Vol'fson et al., "Fundamental Absorption Edge of Silicon Heavily Doped with Donor or Acceptor Impurities," Soviet Physics Semiconductors, vol. 1, No. 3 (Sep. 1967), pp. 327-332.

Vossen et al. "Thin Film Processes II" Academic Press Inc., San Diego, CA 1991, pp. 370-442.

Wolfe et al. "Silicon Processing for the VLSI ERA, vol. 1: Process Tecnology," Marcel Dekker AG, New York, NY, 2000, pp. 1-35.

Öztürk, et al., "Advanced $Si_{1-x}Ge_x$ Source/Drain and Contact Technologies for Sub-70 nm CMOS," IEEE IEDM Technical Digest (2002), pp. 375-378.

Öztürk, et al., "Ultra-Shallow Source/Drain Junctions for Nanoscale CMOS Using Selective Silicon-Germanium Technology," Extended Abstracts of International Workshop on Junction Technology, (2001), pp. 77-82.

Öztürk, et al., "Low Resistivity Nickel Germanosilicide Contacts to Ultra-Shallow $Si_{1-x}Ge_x$ Source/Drain Junctions for Nanoscale CMOS," IEEE IEDM Technical Digest (2003), pp. 497-500.

Öztürk, et al., "Selective Silicon-Gremanium Source/Drain Technology for Nanoscale CMOS," Mat. Res. Soc. Symp. Proc., vol. 717, (2002), pp. C4.1.1-C4.1.12.

* cited by examiner

METHOD OF FABRICATING A SEMICONDUCTOR STRUCTURE THAT INCLUDES TRANSFERRING ONE OR MORE MATERIAL LAYERS TO A SUBSTRATE AND SMOOTHING AN EXPOSED SURFACE OF AT LEAST ONE OF THE MATERIAL LAYERS

PRIORITY INFORMATION

This application is a divisional application of Ser. No. 10/116,559 filed Apr. 4, 2002, now issued as U.S. Pat. No. 6,940,089, which claims priority from provisional application Ser. No. 60/281,502 filed Apr. 4, 2001.

BACKGROUND OF THE INVENTION

The invention relates to the production of a general semiconductor substrate of relaxed $Si_{1-x}Ge_x$-on-insulator (SGOI) for various electronics or optoelectronics applications, the production of strained Si or strained SiGe field effect transistor (FET) devices on SGOI, and the production of monocrystalline III-V or II-VI material-on-insulator substrates.

Relaxed SGOI is a very promising technology as it combines the benefits of two advanced technologies: the conventional SOI technology and the disruptive SiGe technology. The SOI configuration offers various advantages associated with the insulating substrate, namely reduced parasitic capacitances, improved isolation, reduced short-channel-effect, etc. The SiGe technology also has various advantages, such as mobility enhancement and integration with III-V devices.

One significant advantage of the relaxed SGOI substrate, is to fabricate high mobility strained-Si, strained-$Si_{1-x}Ge_x$ or strained-Ge FET devices. For example, strained-Si MOSFETs can be made on the SGOI substrate. The strained-Si MOSFETs on the SGOI has attracted attention because it promises very high electron and hole mobilities, which increase the speed of the electronic circuit. Other III-V optoelectronic devices can also be integrated into the SGOI substrate by matching the lattice constants of III-V materials and the relaxed $Si_{1-x}Ge_x$. For example, a GaAs layer can be grown on $Si_{1-x}Ge_x$-on-insulator where x is equal or close to 1. SGOI may serve as an ultimate platform for high speed, low power electronic and optoelectronic applications.

There are several methods for fabricating SGOI substrates and SGOI FET devices. In one method, the separation by implantation of oxygen (SIMOX) technology is used to produce SGOI. SIMOX uses a high dose oxygen implant to bury a high concentration of oxygen in a $Si_{1-x}Ge_x$ layer, which will then be converted into a buried oxide (BOX) layer upon annealing at a high temperature. One of the main drawbacks is the quality of the resulting $Si_{1-x}Ge_x$ film and the BOX layer. In addition, the Ge segregation during the high temperature anneal also limits the amount of Ge composition to a value that is low, such as 10%. Due to the low Ge composition, the device fabricated on those SGOI substrates has limited performance. For example, the strained-Si MOSFETs fabricated on the SGOI by the SIMOX process have limited electron or hole mobility enhancement due to the low Ge composition, since the mobility enhancement is dependent on Ge composition through the degree of the strain in the strained-Si layer.

In a second method, a conventional silicon-on-insulator (SOI) substrate is used as a compliant substrate. In this process, an initially strained $Si_{1-x}Ge_x$ layer is deposited on a thin SOI substrate. Upon an anneal treatment, the strain in the $Si_{1-x}Ge_x$ layer is transferred to the thin silicon film underneath, resulting in relaxation of the top $Si_{1-x}Ge_x$ film. The final structure is a relaxed-SiGe/strained-Si/insulator. The silicon layer in the structure is unnecessary for an ideal SGOI structure, and may complicate or undermine the performance of devices built on it. For example, it may form a parasitic back channel on the strained-Si, or may confine unwanted electrons due to the band gap offset between the strained-Si and SiGe layer.

In a third method, a similar SGOI substrate is produced using a $p^{++}$ layer as an etch stop. On a first Si substrate, a compositionally graded SiGe buffer is deposited, followed by deposition of multiple material layers including a relaxed SiGe layer, a $p^{++}$ etch stop layer, and a Si layer. After bonding to a second substrate, the first substrate is removed. In an etching process, the compositionally graded SiGe buffer is etched away and etching stops at $P^{++}$ etch stop layer, resulting in a relaxed-SiGe/Si/insulator structure. The presence of the silicon layer in the structure may be for the purpose of facilitating the wafer bonding process, but is unnecessary for ideal SGOI substrates. Again, the silicon layer may also complicate or undermine the performance of devices built on it. For example, it may form a parasitic back channel on this strained-Si, or may confine unwanted electrons due to the band gap offset between the Si and SiGe layer. Moreover, the etch stop of $p^{++}$ in the above structure is not practical when a first graded $Si_{1-y}Ge_y$ layer has a final y value larger than 0.2. This is because the etch rate of KOH will slow down dramatically when KOH reaches the $Si_{1-y}Ge_y$ layer with a Ge composition larger than 0.2, and that layer is itself a very good etch stop for KOH. Therefore, KOH will not be able to remove practically all of the first compositionally graded $Si_{1-y}Ge_y$ layer (when y is larger than 0.2) and the second relaxed SiGe layer, thus using a $p^{++}$ layer as an etch-stop for KOH is not practical.

Other attempts include re-crystallization of an amorphous $Si_{1-x}Ge_x$ layer deposited on the top of a SOI (silicon-on-insulator) substrate. Again, such a structure is not an ideal SGOI substrate and the silicon layer is unnecessary, and may complicate or undermine the performance of devices built on it. The relaxation of the resultant SiGe film and quality of the resulting structure are main concerns.

In a recent method, relaxed $Si_{1-x}Ge_x$-on-insulator is produced by using 20% SiGe layer as an etch-stop. First a compositionally graded $Si_{1-x}Ge_x$ buffer (where x is less than about 0.2) and then a uniform $Si_{1-y}Ge_y$ etch-stop layer (where y is larger than about 0.2) are deposited on the first substrate. Then the deposited layer is bonded to a second insulating substrate. After removing the first substrate and graded buffer layer utilizing the $Si_{1-y}Ge_y$ as an etch-stop, a $Si_{1-y}Ge_y$-on-insulator (SGOI) results. The method makes use of an experimental discovery that $Si_{1-y}Ge_y$ with Ge composition larger than about 20% is a good etch-stop for all three conventional Si etchant systems, KOH, TMAH and EDP, and the selectivity is better than the conventional $p^{++}$ etch stop. In this method the etch-stop $Si_{1-y}Ge_y$ layer is part of the final SGOI structure. However, as the Ge composition in the final SGOI structure is fixed by the etch-stop $Si_{1-y}Ge_y$, if the desired Ge composition in the final SGOI structure is much higher or lower than 0.2, the above method is not practical. If it is much lower than 0.2, for example 0.1, $Si_{0.9}Ge_{0.1}$ is not a good etch stop at all. If it is much larger than 0.2, the Ge composition difference between the etch-stop layer and surface layer in the grade buffer is too big and there is large lattice constant difference between the two layers, which prevents the growth of a relaxed etch-stop $Si_{1-y}Ge_y$ layer with good quality.

From above, clearly an improved method is needed to fabricate a relaxed SGOI substrate with high Ge composition and wide range of Ge composition. An improved method is needed to fabricate strained-Si or strained-SiGe FET devices on SGOI substrate with high Ge composition.

SUMMARY OF THE INVENTION

According to one aspect of the invention, the invention provides a method of semiconductor device fabrication, and more specifically, a method of production of a general semiconductor substrate of relaxed SGOI for various electronics or optoelectronics applications, a method of production of strained Si or strained SiGe FET devices on SGOI, and the production of monocrystalline III-V or II-VI material-on-insulator substrates. The invention provides a method of producing a relaxed $Si_{1-x}Ge_x$-on-insulator substrate with high Ge composition and wide range of Ge composition, and the Ge composition may be much less or much higher than 20%. The invention provides an improved method to fabricate strained-Si or strained-SiGe MOSFET devices on SGOI substrate with high Ge composition. When strained-Si n-MOSFETs are fabricated on relaxed $Si_{1-x}Ge_x$-on-insulators substrates with a high Ge composition, 25% for example, there is significant enhancement on electron mobility as compared to the co-processed bulk-Si MOSFETs on conventional bulk Si substrate.

DETAILED DESCRIPTION OF THE INVENTION

FIGS. 1(a)-1(d) are flow process diagrams of an experimental fabrication process of a SGOI substrate with Ge composition of 25% in accordance with one embodiment of the invention. Starting with a 4-inch Si (100) substrate 2, high quality relaxed $Si_{0.75}Ge_{0.25}$ layer 4 is grown at 900° C. by UHVCVD using a compositionally graded $Si_{1-x}Ge_x$ buffer 6 technique as described in U.S. Pat. No. 5,221,413 issued to Brasen et al., which is incorporated herein by reference, in its entirety. Using this technique, a compositionally graded $Si_{1-x}Ge_x$ buffer 6 can be grown epitaxially on Si substrate, which allows a relaxed SiGe layer to be grown on the top of the buffer with low threading dislocation density.

Figure 2:
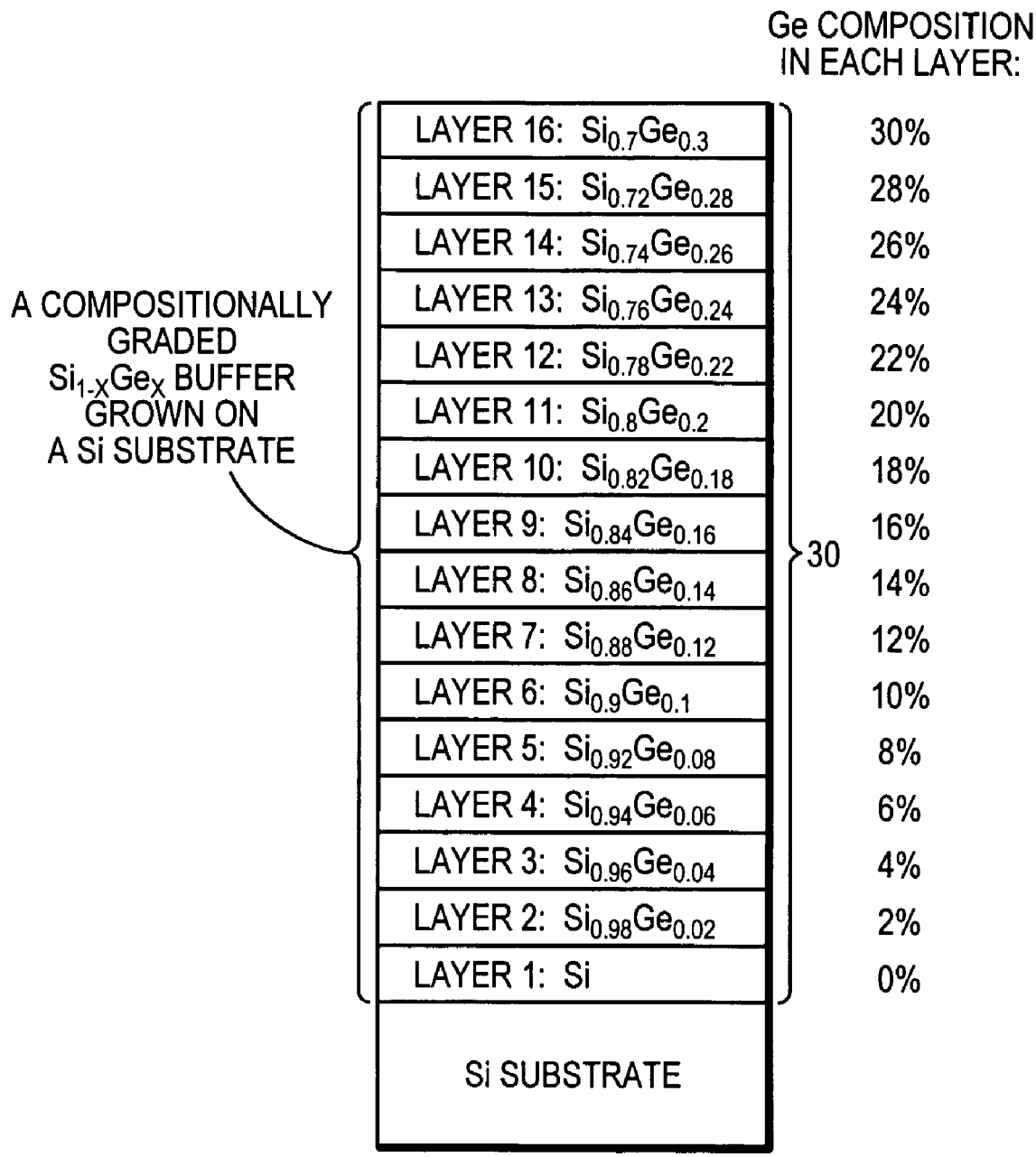
FIG. 2 is a block diagram of a compositionally graded $Si_{1-x}Ge_x$ buffer deposited epitaxially on a Si substrate.

FIG. 2 is a block diagram of a compositionally graded $Si_{1-x}Ge_x$ buffer 30. The compositionally graded $Si_{1-x}Ge_x$ buffer 30 is a multi-layer structure where the Ge composition in each layer is changing gradually from a beginning value to a final value. For example, the compositionally graded $Si_{1-x}Ge_x$ buffer 30 shown in FIG. 2 has 16 layers, and the Ge composition x in the first layer is 0% and is increasing gradually to 2%, 4%, 6% until 30% in the last layer (layer 16). Such a compositionally graded $Si_{1-x}Ge_x$ buffer 30 allows a high quality relaxed $Si_{0.7}Ge_{0.3}$ layer to be grown on the top of the buffer with low threading dislocation density.

Figure 1A:
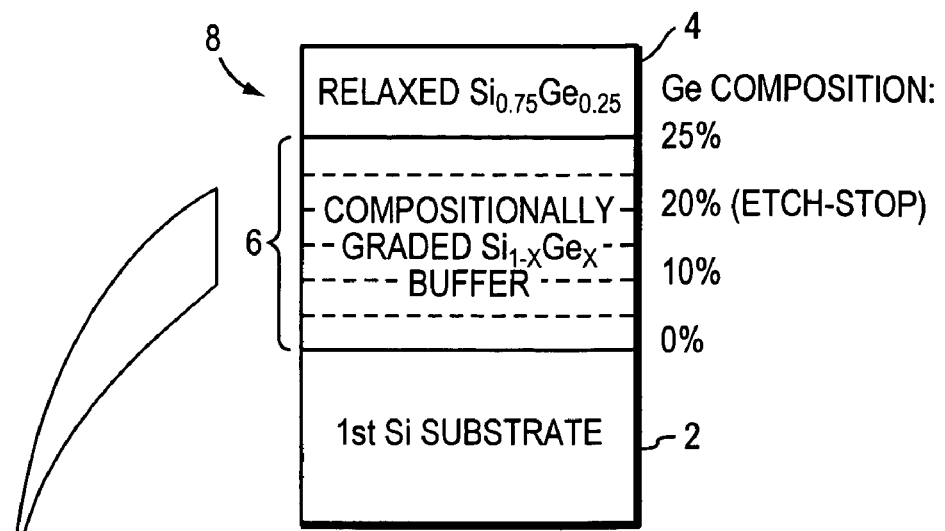
FIGS. 1(a)-1(d) are flow process diagrams of a SGOI substrate fabrication process.
Figure 1B:
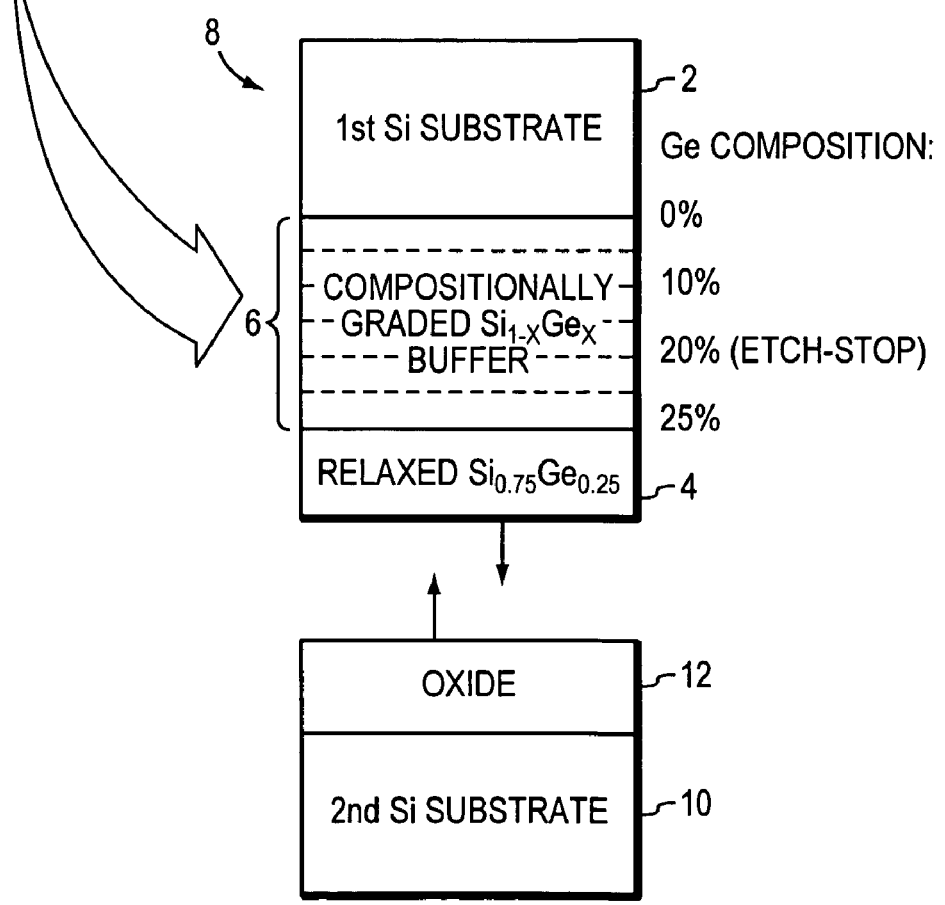
Figure 1C:
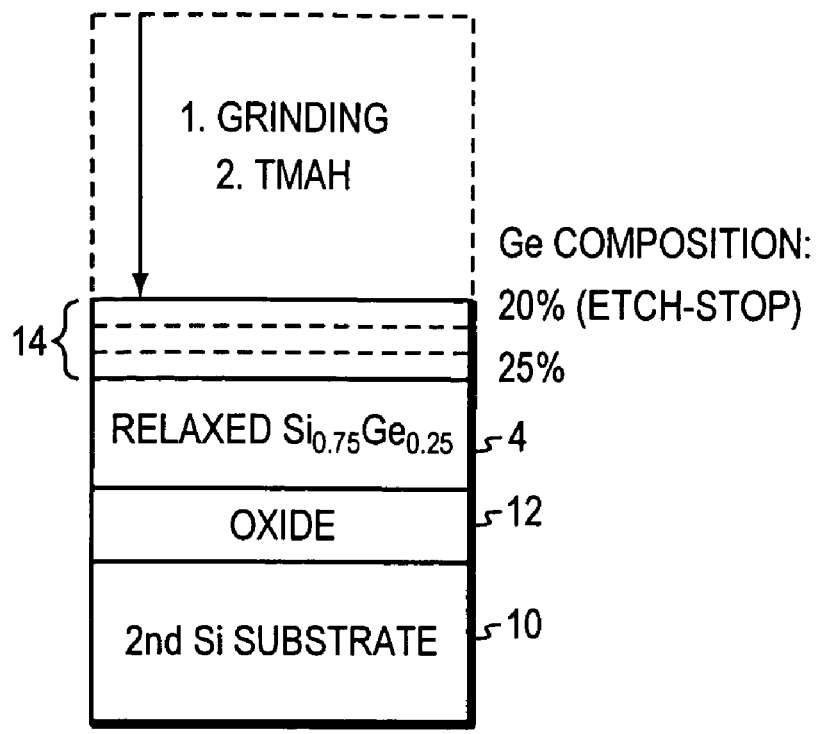

Referring to FIGS. 1(a)-1(d), a compositionally graded $Si_{1-x}Ge_x$ buffer 6 is epitaxially grown on a 4-inch Si (100) substrate 2, where the Ge composition x is increasing gradually from zero to 25% with a grading rate of 10% Ge/μm. Within the compositionally graded $Si_{1-x}Ge_x$ buffer 6, a portion of the buffer 6 with Ge composition larger than about 20% forms a natural etch stop. A 2.5 μm-thick undoped, relaxed $Si_{0.75}Ge_{0.25}$ cap layer 4 is then deposited, as shown in FIG. 1(a). The slow grading rate and high growth temperature result in a completely relaxed cap layer 4 with threading dislocation densities of ~$10^5$ cm$^{-2}$. As shown in FIG. 1(b), the wafer 2 is then flipped over and bonded to a second Si substrate 10, which is thermally oxidized. The oxide 12 in the second substrate will become the insulator layer in the final SiGe-on-insulator substrate. The bonded pair is then annealed at 850° C. for 1.5 hrs. The bonded pair is grounded to remove the donor wafer substrate 8, as shown in FIG. 1(c). The wafer 8 is then subjected to a TMAH solution to etch away a portion of the compositionally graded $Si_{1-x}Ge_x$ buffer 6 with Ge composition less than 20%. The etching process stops approximately at a 20% SiGe layer 14 within the compositionally graded $Si_{1-x}Ge_x$ buffer 6 and the 20% SiGe layer 14 is used as a natural etch stop.

Figure 1D:
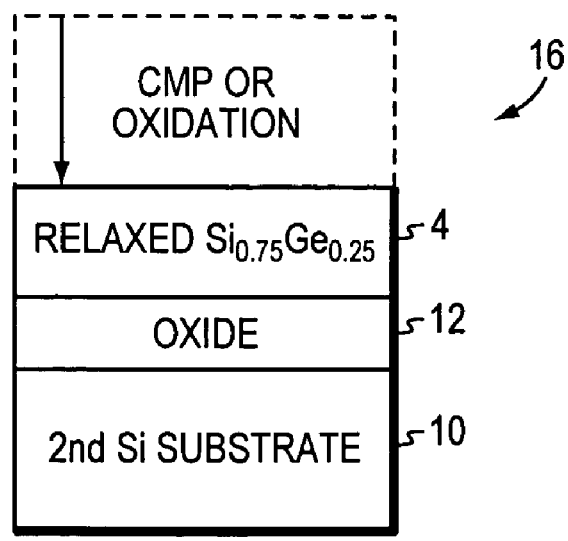
Figure 1E:
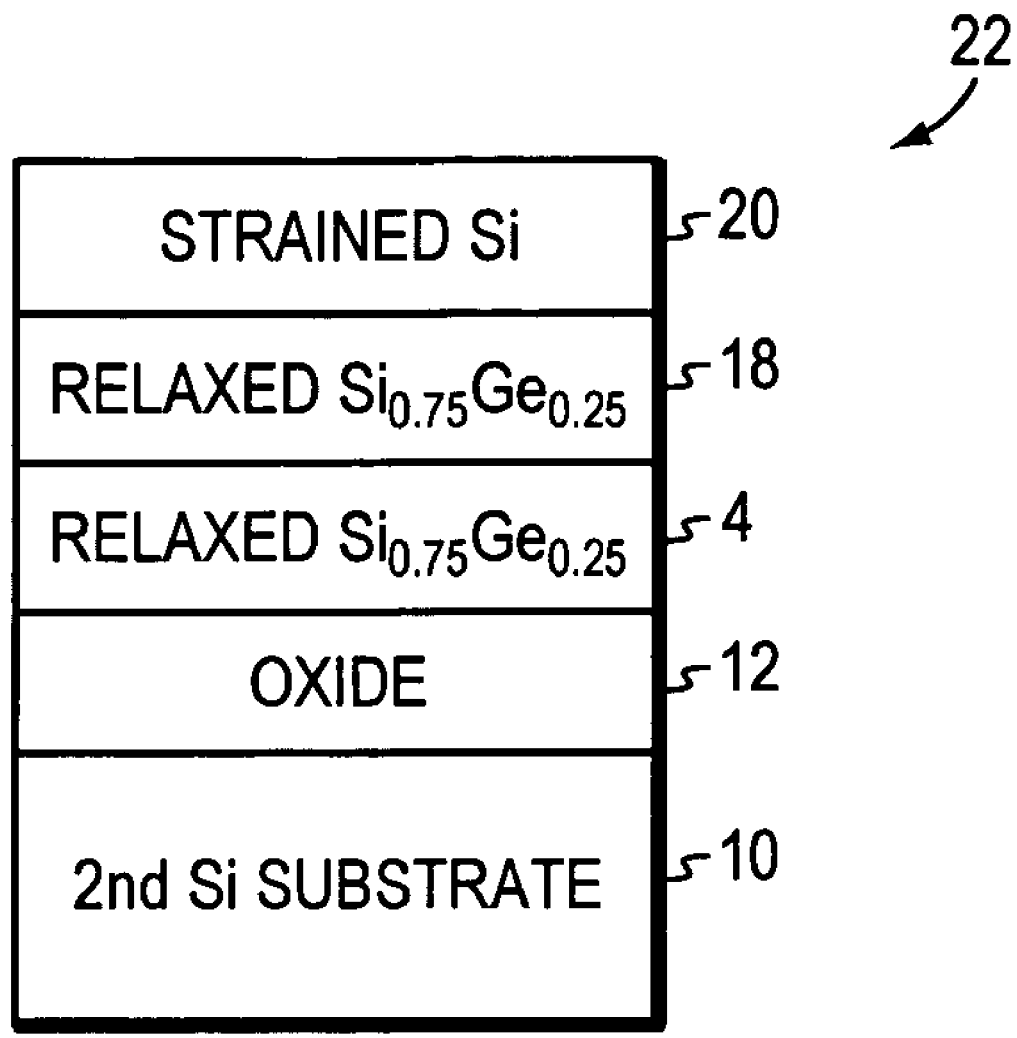
FIG. 1(e) is a block diagram of relaxed SiGe and strained-Si regrowth on a relaxed SGOI substrate for strained-Si MOSFET application.

After performing the etching process, the remaining portion of the compositionally graded $Si_{1-x}Ge_x$ buffer 14 with a Ge composition between 20% to 25% and part of the relaxed $Si_{0.75}Ge_{0.25}$ layer 4 are removed by chemical-mechanical polishing (CMP), resulting in a relaxed $Si_{0.75}Ge_{0.25}$-on-insulator substrate, as shown in FIG. 1(d). The CMP process is also essential in planarizing the SGOI surface for epitaxial regrowth in the next step. As shown in FIG. 1(e), in order to make a strained-Si device 22, a 100 nm p-type (doping $10^{16}$ cm$^{-3}$) relaxed $Si_{1-x}Ge_x$ layer 18 is grown at 850° C. with a Ge composition of 25%, followed by 8.5 nm-thick undoped strained-Si layer 20 grown at 650° C. Electronic devices may be fabricated on the above semiconductor structure. In particular, a large size strained-Si n-MOSFETs can be fabricated on the above structure and significant electron mobility enhancement is observed from the strained-Si MOSFETs.

Figure 3:
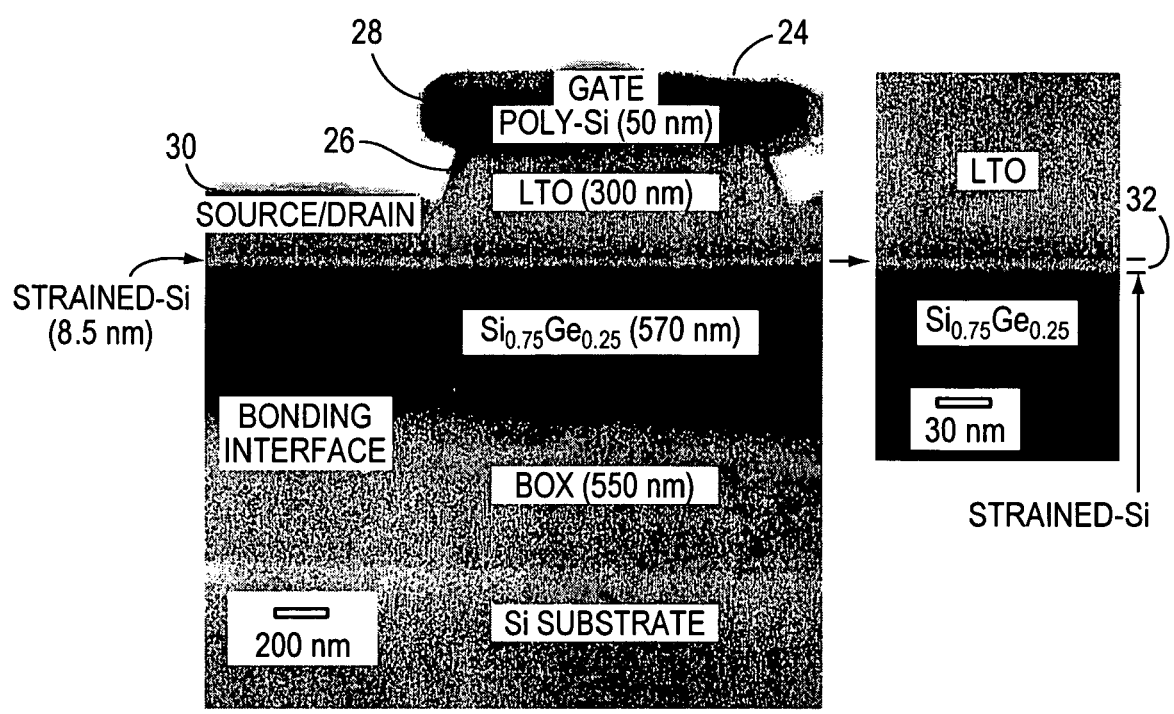
FIG. 3 is a micro-photograph of an exemplary strained-Si surface channel MOSFET device fabricated on relaxed $Si_{0.75}Ge_{0.25}$-on-insulator.

FIG. 3 is a micro-photograph of a strained-Si, surface channel n-MOSFET on the relaxed SGOI substrate. The n-MOSFET includes gate stack 24 that has a 300 nm low temperature oxide (LTO) 26 deposited via LPCVD at 400° C., and 50 nm of poly-Si 28 deposited at 560° C. The large thickness of the LTO gate dielectric 26 facilitates the process, as described below. Capacitors fabricated with LTO have demonstrated interface state densities on par with thermal oxides (~$5 \times 10^{10}$ cm$^{-2}$ eV$^{-1}$). The measured fixed oxide charge density is about $2.4 \times 10^{11}$ cm$^{-2}$.

The gate stack 24 is then patterned and etched into MOSFET structures. A key step is the use of a buffered oxide etchant (BOE) to undercut the gate polysilicon, forming a large "T-gate" geometry. Arsenic ion implants (35 keV, total dose 1×10$^{15}$ cm$^{-2}$) are performed to dope both the source/drain 30 and gate 24 regions at 4 perpendicular directions with a 7° tilt to extend the source/drain regions under the T-gate structure. The dopant is activated via RTA at 1000° C. for 1 s. Since the strained-Si layer 32 is in equilibrium, no relaxation via misfit dislocation introduction occurred. Blanket Ti/Al metallization is performed via e-beam deposition at a perpendicular incidence. Due to the extreme geometry of the "T-gate" FET structure and large gate LTO 26 thickness, breaks occur in the metal which isolate the source, gate, and drain regions 24 and 30 without further lithography.

Long channel n-MOSFETs (effective channel length $L_{eff}$=200 µm) are used to evaluate the electron mobility as a function of the vertical field. The effective electron mobility $\mu_{eff}$ is extracted from the linear regime device current that is defined as:

$$\mu_{eff}=(L_{eff}/W_{eff})I_{DS}/[C_{ox}(V_{GS}-V_T)V_{DS}],  \quad \text{Eq. 1}$$

where $L_{eff}$ is effective channel length, $W_{eff}$ is effective channel width, $I_{DS}$ is current from the drain to source, $C_{ox}$ is the oxide capacitance, $V_{GS}$ is gate to source voltage, $V_{DS}$ is the drain to source voltage, wherein in this embodiment, $V_{DS}$=0.1 V. The oxide capacitance is defined as $$C_{ox}=\epsilon_{ox}/t_{ox} \quad \text{Eq.2}$$

where $\epsilon_{ox}$ is the dielectric constant of oxide, and $t_{ox}$ is the oxide thickness. The oxide capacitance is obtained from C-V measurements on the device, and the oxide thickness $t_{ox}$=326 nm is also extracted from the C-V measurements. The effective vertical field $E_{eff}$ is given by $$E_{eff}=(Q_b+Q_{inv}/2)/\epsilon_S. \quad \text{Eq.3}$$

where $Q_b$ is the bulk depletion charge, $Q_{inv}$ is the inversion charge, and $\epsilon_S$ is the dielectric constant of Si. Because of uncertainties in the strained-Si/Si$_{0.75}$Ge$_{0.25}$ doping, the bulk depletion charge $Q_b$ is not computed from the usual $N_A x_{d.max}$ approximation. Instead, $Q_b$ is extracted from $$E_{ox}\epsilon_{ox}=Q_{inv}+Q_b, \quad \text{Eq.4}$$

where $E_{ox}$ is the electric field in the gate oxide. As a result, the effective field can be approximated by $$E_{eff}=[E_{ox}\epsilon_{ox}-Q_{inv}/2]/\epsilon_S. \quad \text{Eq. 5}$$

The inversion charge $Q_{inv}$ is taken to be $$C_{ox}(V_{GS}-V_T)\cdot E_{ox} \quad \text{Eq.6}$$

and is assumed to be equal to $V_{GS}/t_{ox}$, which holds under the conditions of strong inversion and $V_{GS} \gg V_{DS}$, such that the potential difference between the strongly-inverted Si surface and the S/D regions is negligibly small compared with the large potential drop across the thick gate oxide.

Figure 4:
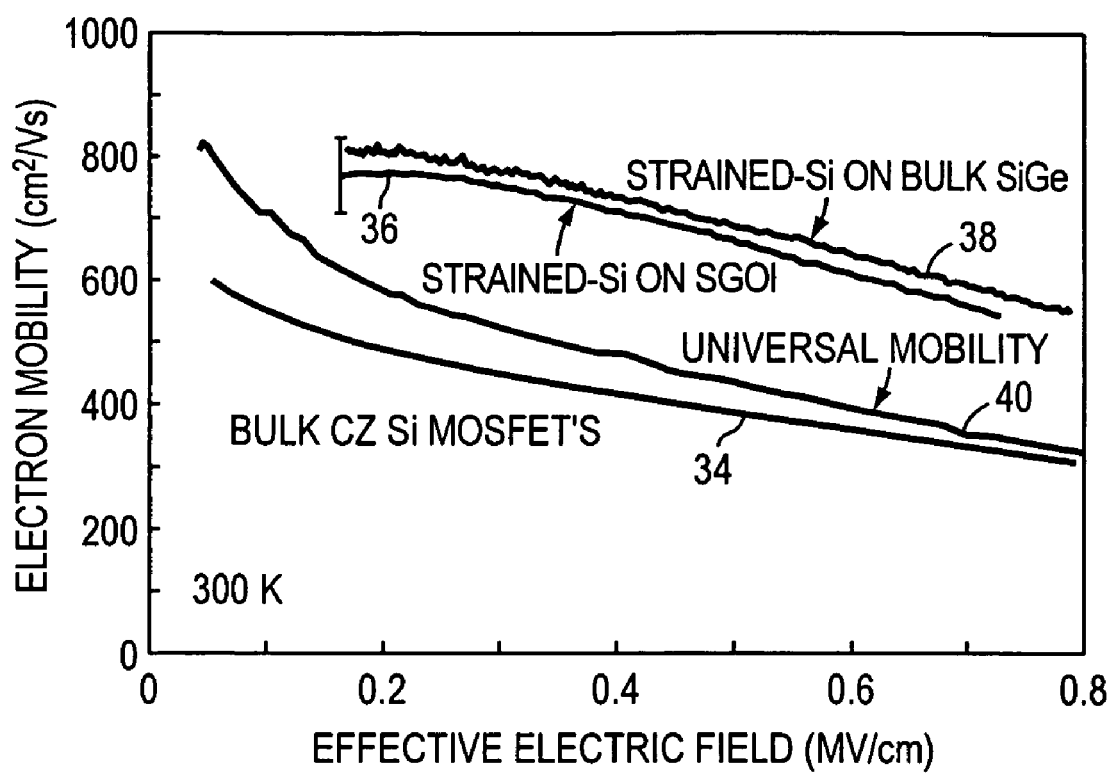
FIG. 4 is a graph showing the measured experimental effective electron mobility as a function of effective vertical electric field from the exemplary strained-Si MOSFET device shown in FIG. 3

FIG. 4 is a graph demonstrating the measured effective electron mobility as a function of the effective vertical electric field on a strained-Si on SGOI. The graph also demonstrates the mobilities of two other controls, such as conventional bulk Si MOSFETs 34 and strained-Si MOSFETs 38 on relaxed bulk SiGe substrate, for comparison. Since all three devices have the same geometry and are processed simultaneously, possible errors due to factors such as the extraction of the ring geometry factor, and approximations in $E_{eff}$ evaluation do not impact the relative comparison of the electron mobility characteristics. As shown in FIG. 4, the measured mobility for the CZ Si control device 34 is close to the universal mobility curve 40. FIG. 4 also shows that the measured electron mobility enhancement for strained Si MOSFETs 36 fabricated on SGOI as compared to the mobility of co-processed bulk Si MOSFETs 38 is significant (~1.7 times). In addition, the electron mobilities are comparable for devices fabricated on SGOI 36 and bulk relaxed SiGe layers 38, thus demonstrating the superior mobility performance introduced by the strained-Si channel is retained in this SGOI structure. This enhancement factor of 1.7 is consistent with previously reported experimental and theoretical values for strained-Si n-MOSFETs on bulk relaxed SiGe films.

This demonstrates that the fabrication of relaxed SGOI structures and strained-Si FET devices on SGOI with high Ge composition of 25% is practical. This also demonstrates that strained-Si MOSFETs fabricated on a SGOI substrate can significantly improve electron mobility. In contrast to the method of fabrication of SGOI by SIMOX process where the high annealing temperature limits the Ge composition to a low value, the process of forming a SGOI in accordance with the invention has a low thermal budget and thus is compatible with a wide range of Ge composition in the SGOI substrate. This embodiment of invention allows fabrication of a SGOI substrate and a strained-Si FET device with high Ge composition, and the Ge composition can be much higher than the Ge composition in the relaxed Si$_{1-y}$Ge$_y$ etch-stop layer where y has a value close to 20%.

In a variation of the above process, before the step of bonding, various of material layers like strained-Si, strained-SiGe, relaxed SiGe may also grown on the relaxed Si$_{0.75}$Ge$_{0.25}$ cap layer 4. For example, a three layer system, a strained-Si, a strained-SiGe and a relaxed SiGe layer, may be deposited before bonding. Therefore, after bonding and layer removal steps, the strained-Si and strained-SiGe layers are on the SGOI structure and can be used to fabricate both n-MOSFET and p-MOSFET devices immediately without a regrowth step.

Figure 5:
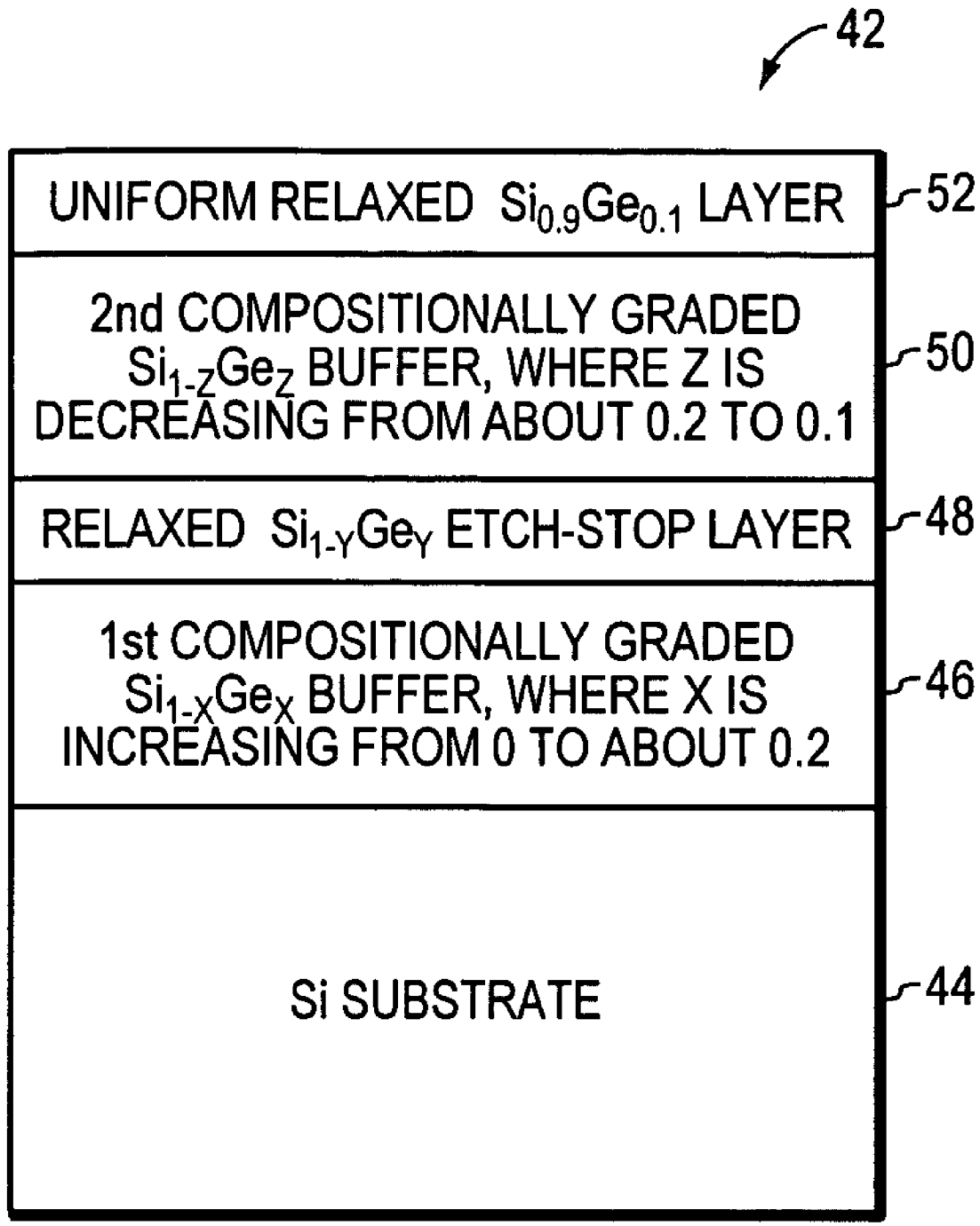
FIG. 5 is a block diagram of another embodiment of a of SGOI structure with 10% Ge.

FIG. 5 is a block diagram of a low Ge composition SGOI substrate. The Ge composition in the SGOI substrate can be considerably less than the Ge composition in a relaxed Si$_{1-y}$Ge$_y$ etch-stop layer where y has a value close to 20%. For example, a SGOI substrate with Ge composition of 10% can be fabricated. As shown in FIG. 5, a compositionally graded Si$_{1-x}$Ge$_x$ buffer 46 is epitaxially grown on a silicon substrate 44, where the Ge composition x is increasing gradually from about zero to about 20%. A uniform etch-stop layer 48 of relaxed Si$_{1-y}$Ge$_y$ is deposited where Ge composition y is larger than or close to about 20%. Then a second compositionally graded Si$_{1-z}$Ge$_z$ buffer 50 is grown on the etch-stop layer 48 where Ge composition z is decreasing gradually from a value close to 20% to a smaller value, in this embodiment 10%. Finally a uniform relaxed Si$_{0.9}$e$_{0.1}$ layer 52 is grown.

After flipping over and bonding to a second substrate, the first substrate is removed. A wet etch of KOH or TMAH removes the first graded buffer and stops at the etch-stop layer 48. After the etch-stop layer 48 and second compositionally graded Si$_{1-z}$Ge$_z$ buffer 50 are removed, the relaxed Si$_{0.9}$Ge$_{0.1}$ layer 52 is released, resulting in a Si$_{0.9}$Ge$_{0.1}$-on-insulator substrate. In summary, this process allows the production of SGOI with Ge composition much less than 20%.

The embodiment outlined in FIG. 1 is also applicable to the fabrication of SGOI structures with very high Ge composition, for example 80%. However, the $Si_{0.2}Ge_{0.8}$ layer in the final SGOI structure may not have good thickness uniformity for such high Ge composition. The SiGe layer thickness uniformity is important. For example, to fabricate strained-Si MOSFET devices on a SGOI structure, the performance of the devices strongly depends on the thickness of the $Si_{0.2}Ge_{0.8}$ layer. A uniform SiGe layer is highly desired. To fabricate SGOI with Ge composition of 80% using the method described in FIG. 1, it necessitates the deposition of a relative thick compositionally graded $Si_{1-x}Ge_x$ buffer where the Ge composition is increasing gradually from zero to 80%. A TMAH or KOH etch step etches away the portion of the compositionally graded $Si_{1-x}Ge_x$ buffer where Ge composition is less than 20% and stops at 20% SiGe layer within the compositionally graded $Si_{1-x}Ge_x$ buffer. The remaining portion of the compositionally graded $Si_{1-x}Ge_x$ buffer is still considerably thick, where Ge composition varies from about 20% to 80%. For example, the remaining portion of the compositionally graded $Si_{1-x}Ge_x$ buffer with Ge composition from 20% to 80% has a thickness of 6 μm if the buffer is grown with a grading rate of 10% Ge/μm.

This 6 μm thick buffer needs to be removed in order to explore the $Si_{0.2}Ge_{0.8}$ layer, for example by means of CMP. This removing step may induce significant non-uniformity. There are two possible sources of non-uniformity. First, the growth of the SiGe film itself may be not uniform across the whole substrate. For example, it is observed that the SiGe buffer can vary more than 10% in thickness if the surface of the Si substrate is placed in parallel to the direction of reactant gas flow in the CVD reactor during growth. In this orientation, one part of the substrate is in contact with higher concentration of gas than the other part since the gas concentration is decreasing along its flow pass as gas gets consumed. Therefore, the growth rate is different, resulting in differences of layer thickness. To avoid this non-uniformity, it is preferred that the surface of the Si substrate be placed normal to the direction of reactant gas flow in the reactor during the growth.

The second source comes from the removing process of the buffer layer. For example, if the buffer layer is removed by a polishing technique such as CMP, the CMP process may induce some uniformity. Although the CMP can improve the local uniformity, it may induce some global non-uniformity across the wafer. For example, the CMP process may polish the edge of the wafer faster than the center. As a result, the final SGOI structure has a non-uniform SiGe layer. Using two or more etch-stops, the system can improve the uniformity as described in the embodiment below.

Figure 6:
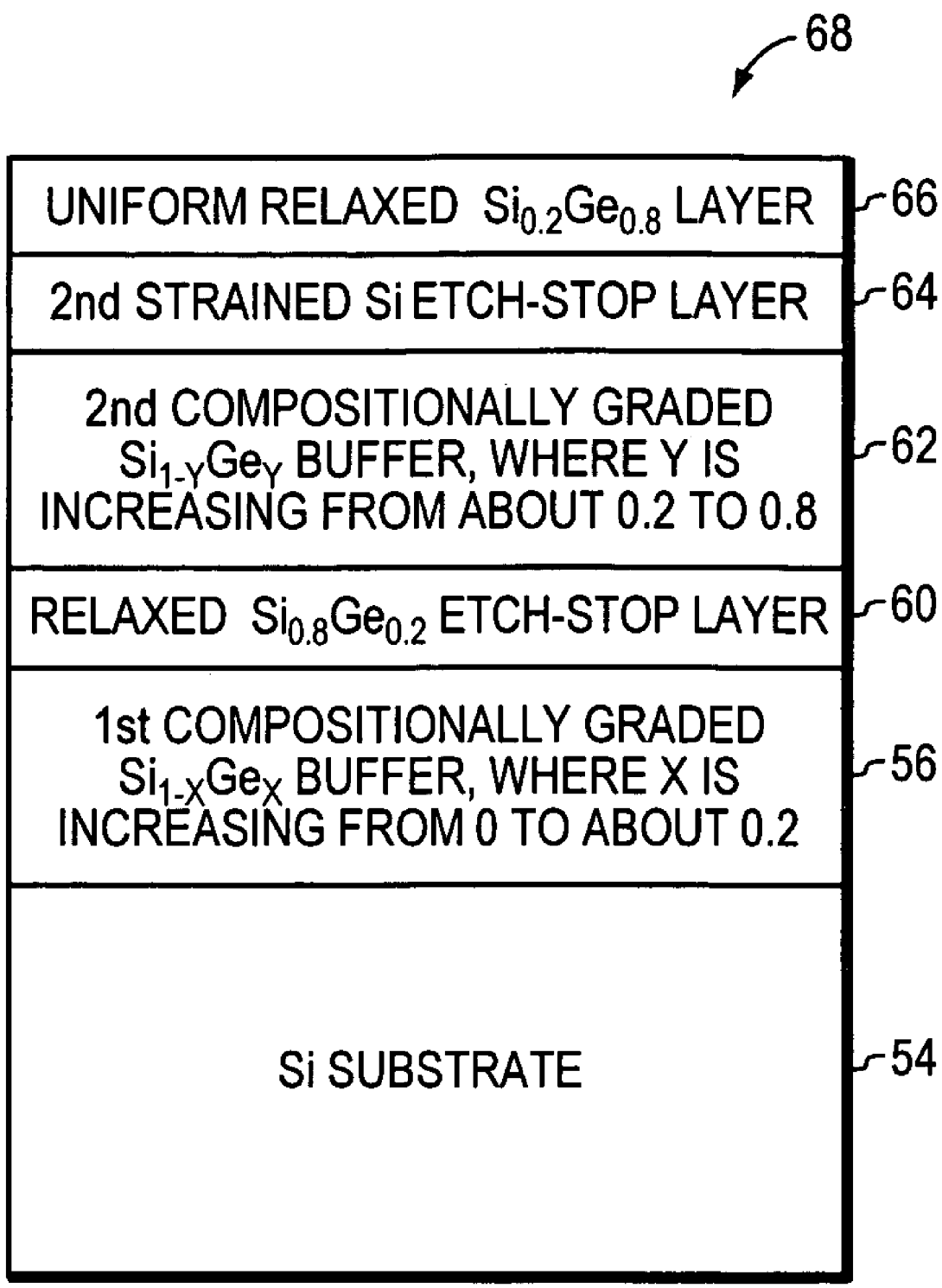
FIG. 6 is a block diagram of another embodiment of a SGOI structure with 80% Ge using two etch-stops.

FIG. 6 is block diagram of a SGOI substrate with improved SiGe layer uniformity using two etch stop layers, which is especially suitable for SGOI substrates with high Ge composition. As shown in FIG. 6, a compositionally graded $Si_{1-x}Ge_x$ buffer 56 is grown on a silicon substrate 54, where Ge composition x is increasing gradually from zero to about 0.2. A uniform etch-stop layer 60 of $Si_{0.8}Ge_{0.2}$ is deposited, and then a continuing compositionally graded $Si_{1-y}Ge_y$ buffer 62 is provided where Ge composition y is increasing gradually from about 0.2 to a higher value, for example 0.8. A second etch-stop layer 64 of strained-Si is then grown. A uniform $Si_{0.2}Ge_{0.8}$ layer 66 is deposited with a Ge composition of 80%. After flipping over and bonding to a second insulating substrate, the first substrate s removed. During a first etching step, the first compositionally graded $Si_{1-x}Ge_x$ buffer 56 is removed and the etching stops at the first etch-stop layer 60 of $Si_{0.8}Ge_{0.2}$. With another etching step, the second compositionally graded $Si_{1-y}Ge_y$ buffer 62 is removed and the etching stops at the second etch-stop layer 64 of strained-Si. Removing the second etch-stop layer 64, the final relaxed $Si_{0.2}Ge_{0.8}$ layer 66 is released, resulting in a $Si_{0.2}Ge_{0.8}$-on-insulator substrate. {In the above process, the surface of the deposited layers may be very rough due to the crosshatch in the SiGe buffer. A smoother strained-Si and relaxed SiGe layer may be wanted. A CMP step can be used for this purpose to smooth for example the compositionally graded $Si_{1-y}Ge_y$ buffer 62, before depositing the second etch-stop layer 64.

Figure 7:
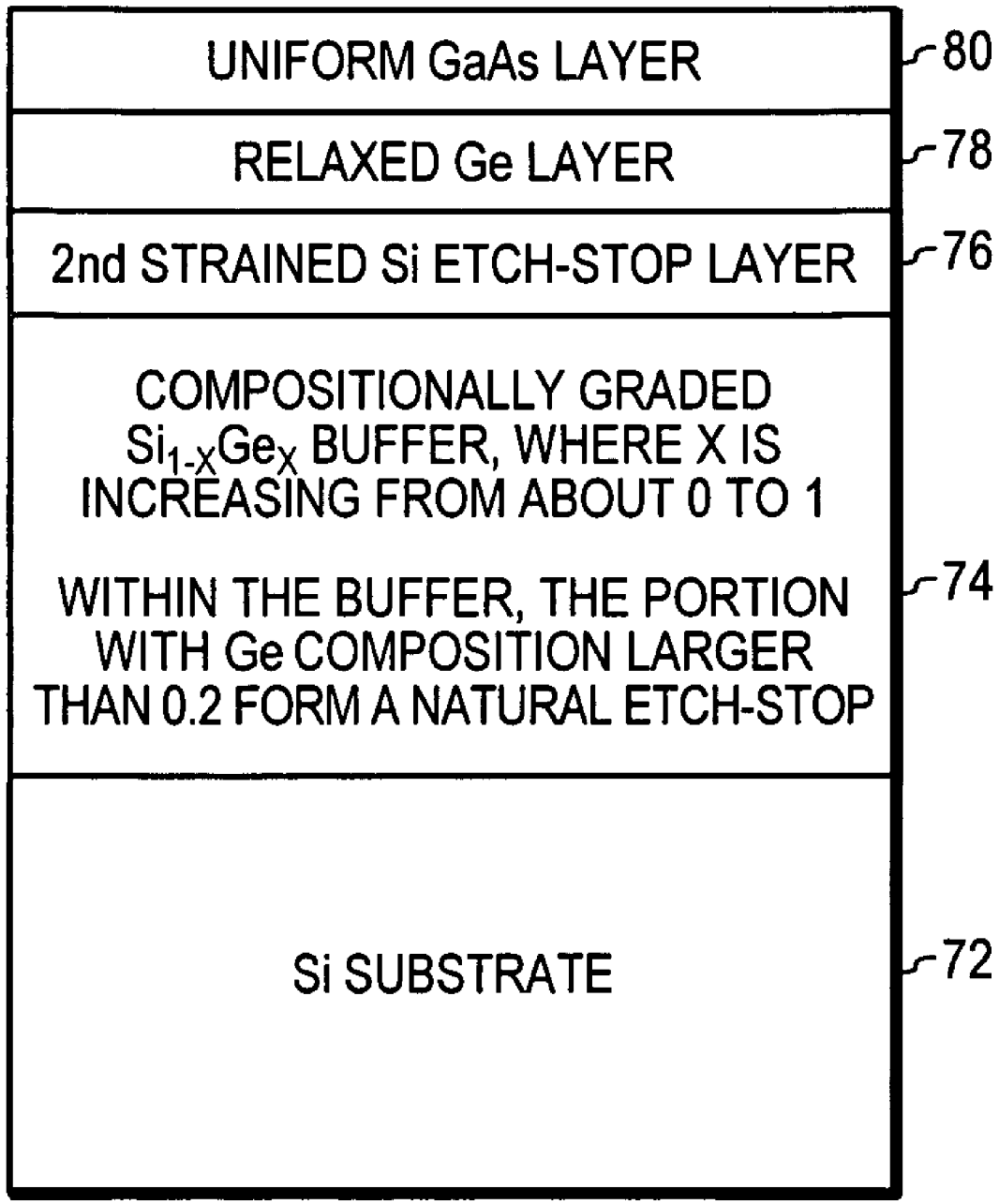
FIG. 7 is a block diagram showing the production of an III-V on insulator structures.

FIG. 7 is a block diagram of a GaAs-on-insulator substrate. As shown in FIG. 7, a compositionally graded $Si_{1-x}Ge_x$ buffer 74 is grown on a silicon substrate 72, where Ge composition x is increasing gradually from zero to about 1, i.e., to pure Ge composition. Within the compositionally graded $Si_{1-x}Ge_x$ buffer, a portion of the buffer with Ge composition larger than about 20% forms a natural SiGe etch stop. Then a second etch-stop layer 76 of strained-Si is grown, followed by a relaxed Ge layer 78. A uniform GaAs layer 80 is then deposited. After flipping over and bonding to a second insulating substrate, the first substrate is removed. During the first etching step, the portion of the compositionally graded $Si_{1-x}Ge_x$ buffer 74 with Ge composition smaller than 20% is removed and the etching stops at the first etch-stop layer. With the second etching step, the remaining compositionally graded $Si_{1-x}Ge_x$ buffer 74 is removed and the etching stops at the second etch-stop layer 76 of strained-Si. Removing the second etch-stop layer 76 of strained-Si and the Ge layer 78 results in a GaAs-on-insulator structure.

In all of the above-mentioned SGOI or GaAs-on-insulator fabrication processes, wafer bonding is used. In order to bond two surfaces, the surfaces should be smooth enough, with a very small surface roughness. However, the as-grown SiGe layer, strained Si layer, Ge layer or GaAs layer can be rough. Typically, the compositionally graded SiGe buffer shows a very rough surface due to the cross-hatch (a dislocation-induced phenomenon). The CMP process is conventionally used to smooth the surface before bonding. However, as described above, CMP may induce global non-uniformity across the wafer. Moreover, in some cases, there may not be enough thickness for a surface to be polished. For example, if a layer is a strained Si etch-stop layer, its thickness is very small in order to keep it strained without relaxation, for example 10 nm.

Two approaches may be used to solve this issue. The first approach is before depositing the last thin material layer (e.g., the last layer is a strained Si layer), polish the SiGe buffer layer to achieve enough surface smoothness. Then grow the last strained Si etch-stop layer, which results in a smoother final surface. If the surface is smooth enough, the structure can be bonded directly. Even if polishing is still needed, it will reduce the thickness to be polished.

The second approach requires before bonding to deposit an additional insulating material layer like an oxide layer on the first structure. Afterward, polish this additional insulating layer to achieve enough surface smoothness, and then bond the polished insulating layer to a second substrate.

Figure 8:
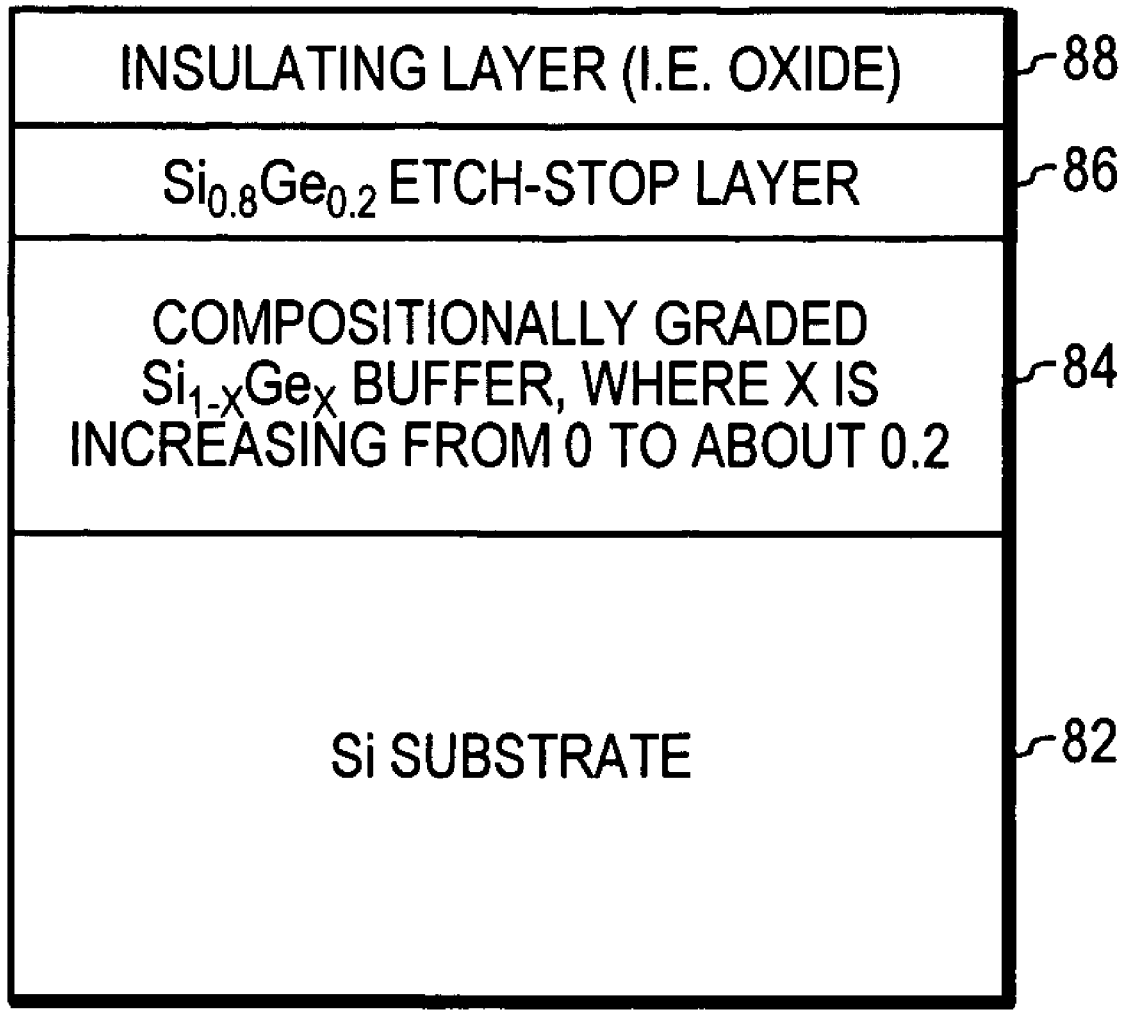
FIG. 8 is a block diagram of another embodiment of a SGOI structure with improved SiGe layer thickness uniformity.

FIG. 8 is a block diagram of a $Si_{0.8}Ge_{0.2}$-on-insulator substrate with improved $Si_{0.8}Ge_{0.2}$ layer uniformity. As shown in FIG. 8, a compositionally graded $Si_{1-x}Ge_x$ buffer 84 is grown on a silicon substrate 82, where Ge composition x is increasing gradually from zero to about 20%. Then a $Si_{0.8}Ge_{0.2}$ etch-stop layer 86 with selected thickness is deposited. The $Si_{0.8}Ge_{0.2}$ etch-stop layer 86 will also contribute to the SiGe layer in the final $Si_{0.8}Ge_{0.2}$-on-insulator substrate. The thickness of the $Si_{0.8}Ge_{0.2}$ etch-stop layer 86 is thick enough to sustain the selective etch process. This thickness is also chosen deliberately such that the resulting final $Si_{0.8}Ge_{0.2}$-on-insulator substrate has a desired $Si_{0.8}Ge_{0.2}$ layer thickness. For example, for the purpose of fabricating high mobility strained-Si MOSFET on $Si_{0.8}Ge_{0.2}$-on-insulator substrate, a final $Si_{0.8}Ge_{0.2}$ layer 86 thickness of 100 nm or less may be desired. After the deposition of $Si_{0.8}Ge_{0.2}$ etch-stop layer 86, an additional insulating layer is deposited, for example an oxide layer 88. The oxide layer 88 is polished by CMP to achieve surface smoothness required by wafer bonding. By doing this, the polishing of $Si_{0.8}Ge_{0.2}$ etch-stop layer 86 is avoided. Without the polishing step, the $Si_{0.8}Ge_{0.2}$ etch-stop layer 86 can maintain its good uniformity. After flipping over and bonding to a second substrate, the first substrate is removed. After a selective etching process with TMAH or KOH, which removes the compositionally graded $Si_{1-x}Ge_x$ buffer and stops at the $Si_{0.8}Ge_{0.2}$ etch-stop layer 86, a final $Si_{0.8}Ge_{0.2}$-on-insulator substrate results. The structure has good SiGe layer uniformity. Polishing may be used to smooth the $Si_{0.8}Ge_{0.2}$ surface after etching without removing too much material. Then strained-Si is grown on the SGOI structure and strained-Si MOSFET may be fabricated on the SGOI with Ge composition of 20%.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a semiconductor structure comprising:
    providing a first semiconductor substrate;
    forming a first structure over the first semiconductor substrate by:
        depositing a compositionally graded $Si_{1-x}Ge_x$ buffer layer on the first semiconductor substrate, wherein a Ge composition x increases to a value greater than 0.2 and a portion of the compositionally graded $Si_{1-x}Ge_x$ buffer layer comprises a Ge composition greater than about 20%, and
        depositing one or more first material layers comprising at least one of relaxed $Si_{1-y}Ge_y$, strained $Si_{1-z}Ge_z$, strained-Si, Ge, GaAs, III-V materials, or II-VI materials, wherein Ge compositions y and z are values selected from a range of 0 to 1;
    bonding the first structure to a second substrate;
    removing the first substrate and at least a portion of the compositionally graded $Si_{1-x}Ge_x$ buffer layer;
    removing any remaining portion of the compositionally graded $Si_{1-x}Ge_x$ buffer layer, thereby exposing at least one of the one or more first material layers; and
    smoothing a surface of the exposed at least one of the one or more first material layers.

2. The method of claim 1, wherein the second substrate comprises an insulating layer disposed on a surface thereof.

3. The method of claim 1 further comprising forming an insulating layer over the one or more first material layers before bonding.

4. The method of claim 1 further comprising smoothing a surface of one of the one or more first material layers before bonding.

5. The method of claim 1 further comprising smoothing a surface of the first structure before bonding.

6. The method of claim 1, further comprising:
    after smoothing the surface of the exposed at least one of the one or more first material layers, depositing one or more second material layers over the exposed at least one of the one or more first material layers, the one or more second material layers including at least one of relaxed $Si_{1-y}Ge_y$, strained $Si_{1-z}Ge_z$, strained-Si, Ge, GaAs, III-V materials, or II-VI materials, where Ge compositions y and z are values selected from a range of 0 to 1.

7. The method of claim 1 further comprising fabricating a semiconductor device selected from the group consisting of a FET device, a MOSFET device, a MESFET device, a solar cell device, and an optoelectronic device.

8. The method of claim 1 wherein the Ge composition x increases from about 0 to a value greater than 0.2.

* * * * *